(12) United States Patent
Nose et al.

(10) Patent No.: US 8,115,540 B2
(45) Date of Patent: Feb. 14, 2012

(54) AMPLIFYING APPARATUS, METHOD OF OUTPUT CONTROL AND CONTROL PROGRAM

(75) Inventors: Koichi Nose, Tokyo (JP); Haruya Ishizaki, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 101 days.

(21) Appl. No.: 12/440,977

(22) PCT Filed: Sep. 13, 2007

(86) PCT No.: PCT/JP2007/067836
§ 371 (c)(1),
(2), (4) Date: Mar. 12, 2009

(87) PCT Pub. No.: WO2008/032782
PCT Pub. Date: Mar. 20, 2008

(65) Prior Publication Data
US 2010/0052792 A1    Mar. 4, 2010

(30) Foreign Application Priority Data

Sep. 14, 2006   (JP) ................................ 2006-250123

(51) Int. Cl.
*H03F 3/38* (2006.01)
(52) U.S. Cl. ......................................... 330/10; 330/251
(58) Field of Classification Search .................... 330/10, 330/251, 207 A
See application file for complete search history.

(56) References Cited

U.S. PATENT DOCUMENTS

| | | | | |
|---|---|---|---|---|
| 4,554,512 A * | 11/1985 | Aiello | ............................. | 330/10 |
| 5,381,109 A * | 1/1995 | Cripe et al. | ...................... | 330/10 |
| 5,767,740 A * | 6/1998 | Fogg | ................................ | 330/10 |
| 6,734,725 B2 * | 5/2004 | Masuda et al. | .................. | 330/10 |
| 6,812,785 B2 * | 11/2004 | Masuda et al. | .................. | 330/10 |
| 7,701,307 B2 * | 4/2010 | Beale et al. | .................... | 332/107 |
| 7,782,135 B2 * | 8/2010 | Berkhout | ...................... | 330/251 |

FOREIGN PATENT DOCUMENTS

| | | | |
|---|---|---|---|
| JP | 1978051948 A | | 5/1978 |
| JP | 1980149512 A | | 11/1980 |
| JP | 1987217708 A | | 9/1987 |
| JP | 1988184413 A | | 11/1988 |
| JP | 1989284106 A | | 11/1989 |

OTHER PUBLICATIONS

International Search Report for PCT/JP2007/067836 mailed Nov. 13, 2007.
D.C. Cox, "Linear Amplification with Nonlinear Components", IEEE Transaction on Communications, Dec. 1974, p. 1942-1945.

* cited by examiner

*Primary Examiner* — Henry K Choe

(57) ABSTRACT

To provide, for example, a pulse input type power amplifying apparatus that can be operated at low voltage and low power, effectively suppressing generation of harmonic component. The amplifying apparatus includes at least two amplification circuits, one and other amplification circuits, composed of multiple amplifiers whose output sides are connected to each other, driven at the same frequency. The multiple amplifiers forming the one amplification circuit are configured with a first inverting amplifier M12 inputting and amplifying a reference pulse, and a second inverting amplifier M11 to which an inverted pulse formed by shifting and inverting the phase of the reference pulse is inputted. The other amplification circuit is configured with the first inverting amplifier M14 and the second inverting amplifier M13 to each of which other wide pulse with a width greater than that of the reference pulse is commonly inputted.

21 Claims, 42 Drawing Sheets

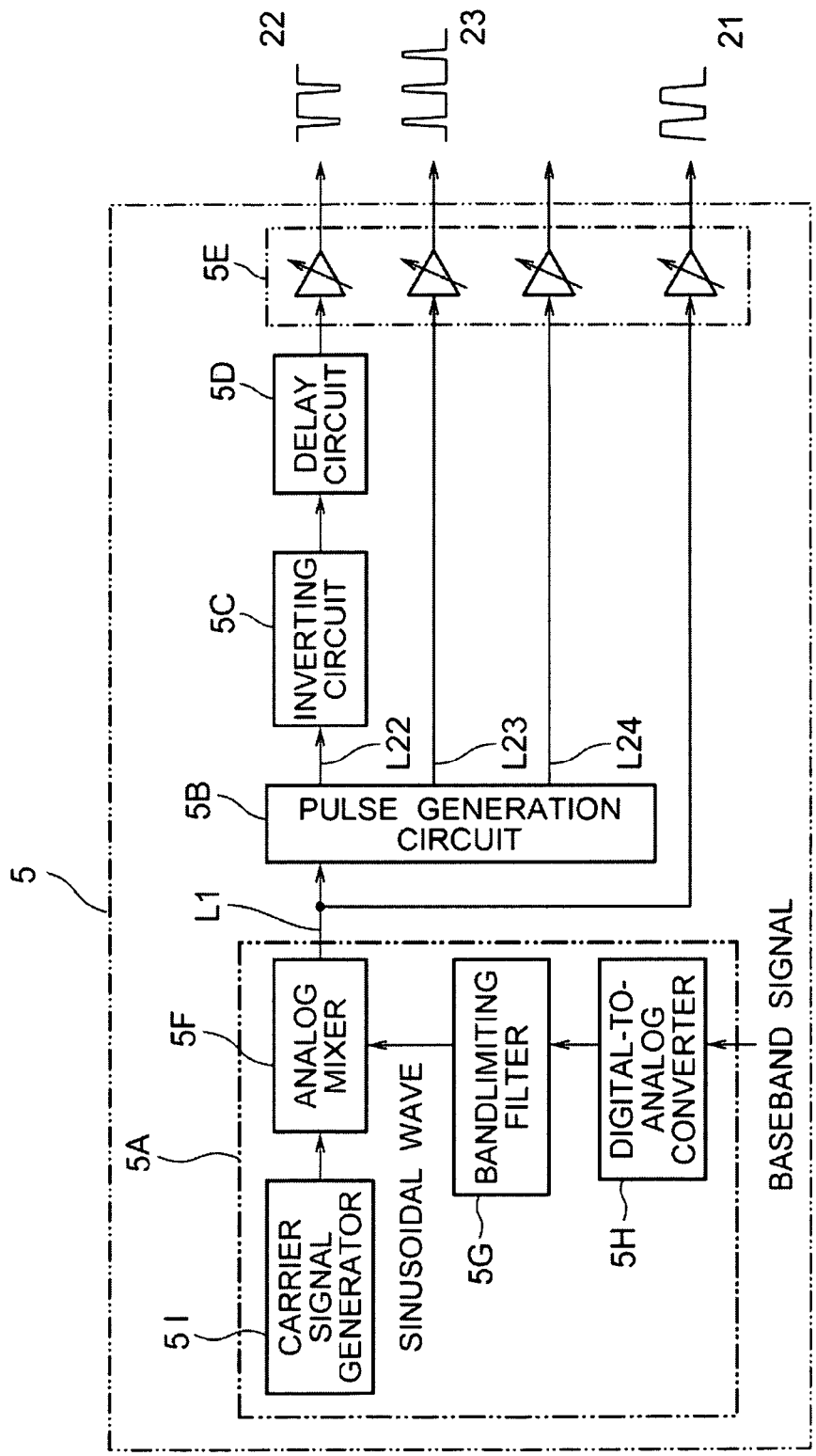

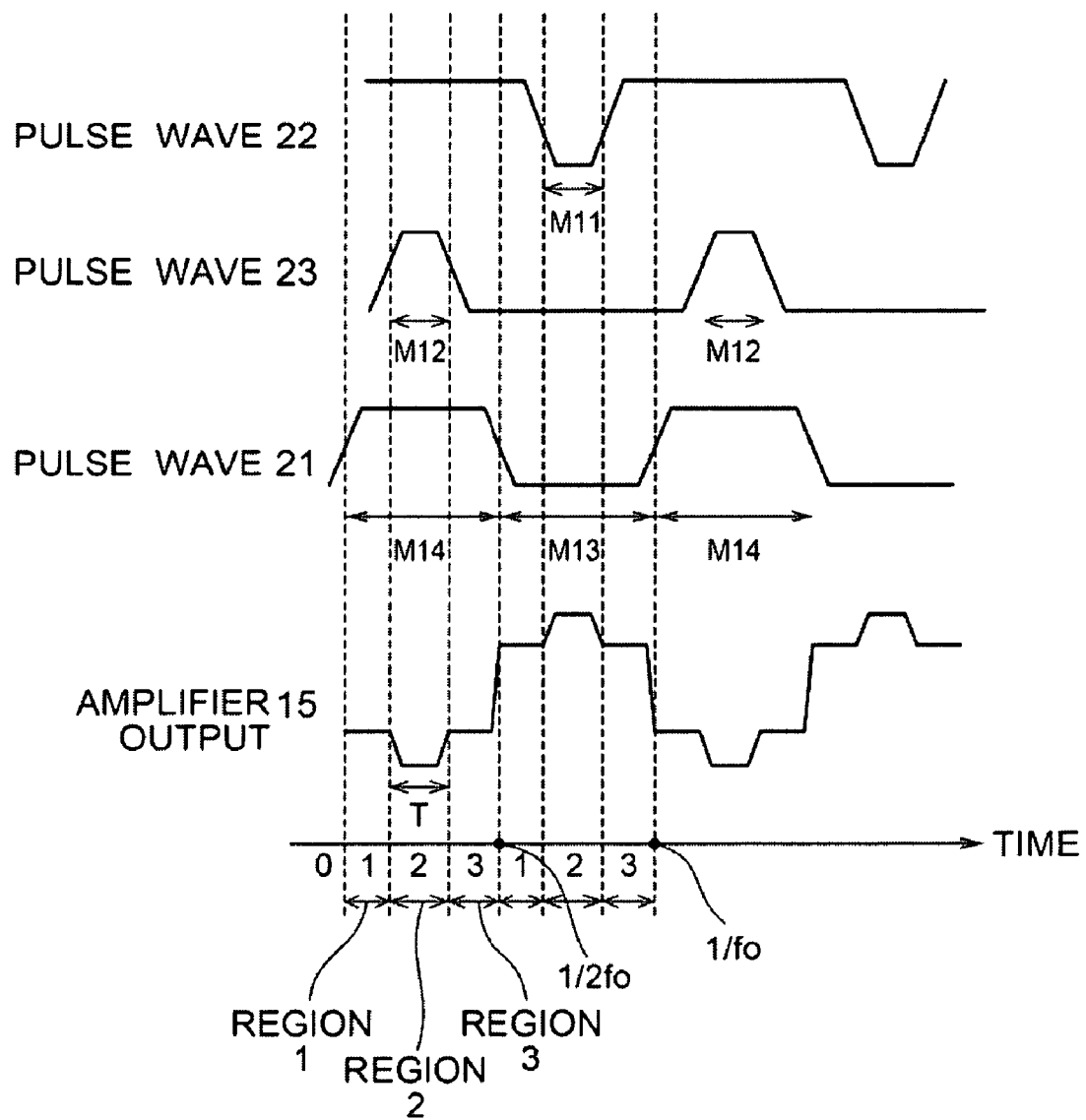

FIG.25
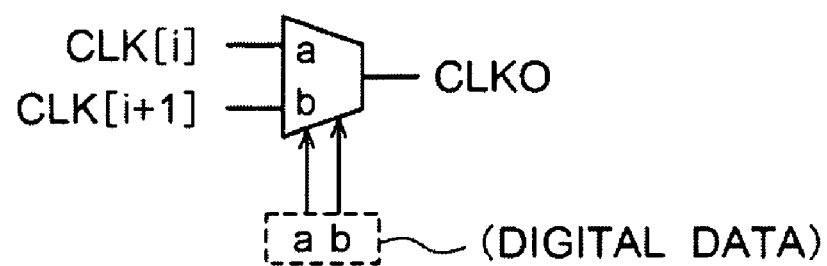
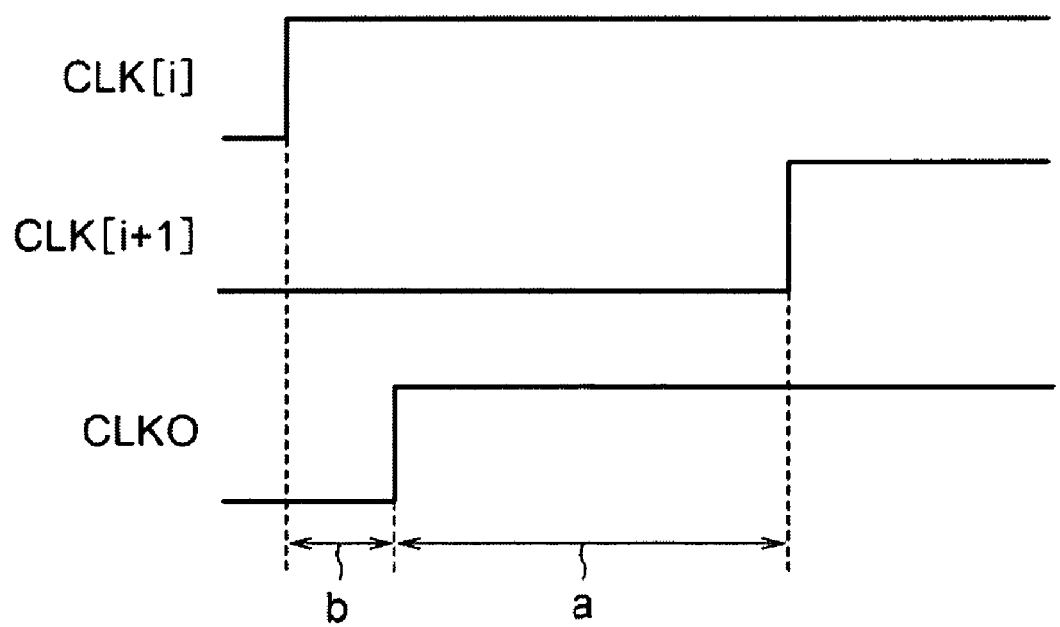

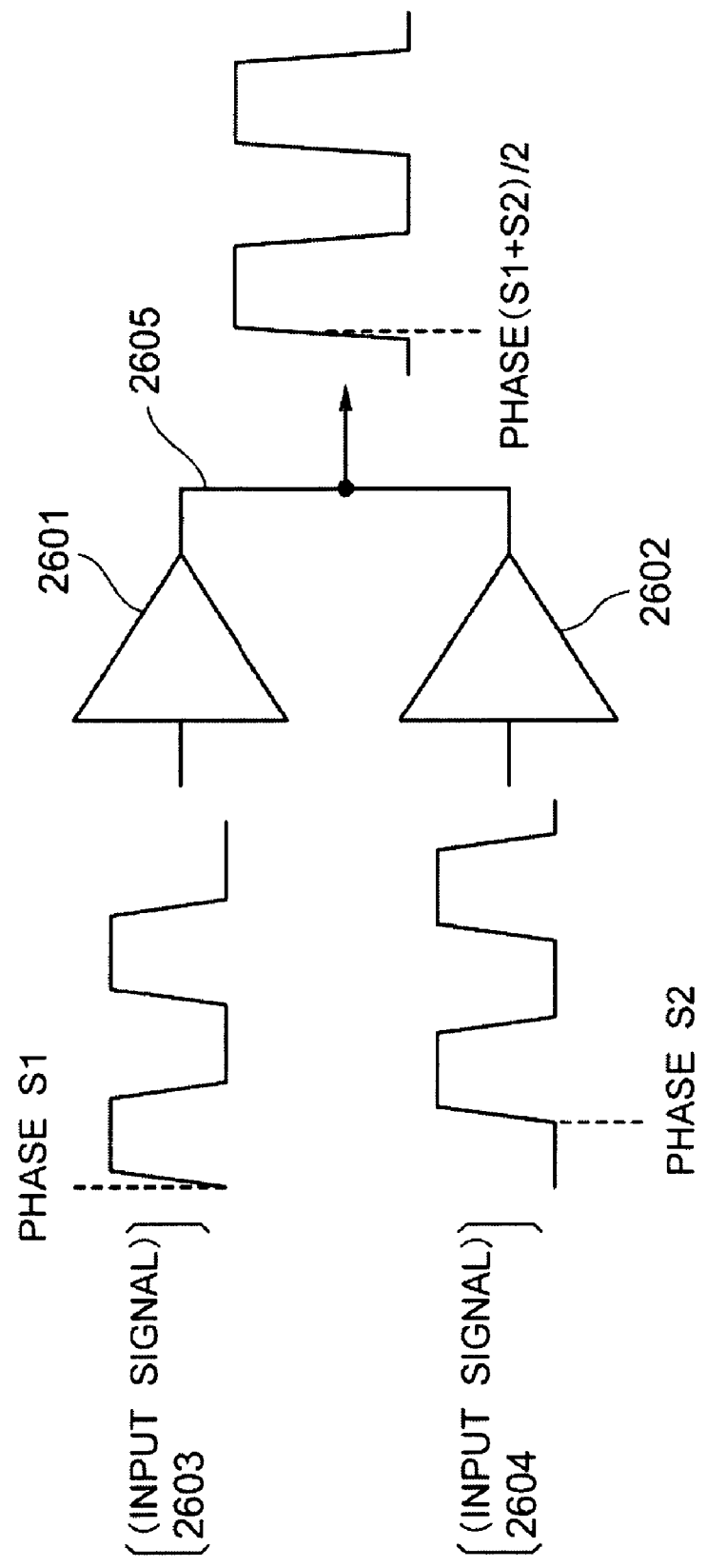

AMPLIFYING APPARATUS, METHOD OF OUTPUT CONTROL AND CONTROL PROGRAM

The present application is the National Phase of PCT/JP2007/067836, filed Sep. 13, 2007, which is based upon and claims priority from Japanese Patent Application No. 2006-250123 filed on Sep. 14, 2006, the entire disclosure of which is incorporated herein.

TECHNICAL FIELD

The present invention relates to an amplifying apparatus and the like, and in particular, to an amplifying apparatus configured with a plurality of amplifiers that are connected in parallel when viewed from an output side, for suppressing harmonic component of an amplifier output.

BACKGROUND ART

Among radio transmission technologies, an amplification circuit called "power amplifier" has been known as a device for transmitting power to an antenna. For this amplification circuit, it is required to comply with radio standards determined by respective countries, and further, under such a condition, miniaturizing a transmitting device, lowering costs, and reducing power consumption are cited as important issues.

A major radio standard concerning the power amplifier requires that the power spectrum outputted from an antenna be a prescribed value or less. That is, when a carrier frequency is f0, harmonic components such as multiplying of the carrier frequency, i.e., 2f0, 3f0, . . . , are required to be attenuated to a value according to the radio standard.

As a typical power amplifier, there is one configured with a bias voltage generation circuit 1701, an inductor 1702, an NMOS transistor M171, and a band transmitting filter 1714, as shown in FIG. 33, for example. This power amplifier converts a bias voltage having a sinusoidal waveform properly by the bias voltage generation circuit, and inputs the converted waveform to a gate of the NMOS transistor M171. This NMOS transistor M171 operates as an amplification circuit, and the inductor 1702 operates as a constant power source for alternating-current. Consequently, the inputted sinusoidal wave is amplified and outputted from the amplifier output.

Further, by passing the signal through the band transmission filter 1714, the harmonic component contained in the output signal are removed, so that the harmonic component can be attenuated to the value according to the radio standard, and the sinusoidal wave signal obtained as described is outputted from an antenna 1716 as shown in FIG. 34.

However, there has been such disadvantages that the amplification circuit requires an analog circuit or the like for generating a sinusoidal wave, and its design becomes complicated, and further, since the analog circuit is difficult to be operated by a low-voltage power source, it is hard to be applied to a fine circuit processing whose breakdown voltage is low.

Also, for a power amplifier that does not need to generate the sinusoidal wave, a circuit which uses a pulse wave instead of the sinusoidal wave for input, as shown in FIG. 35, has been widely used. The circuit shown in FIG. 35 is configured with an NMOS transistor M221, an inductor 2202, and a band filter 2214.

However, in this kind of configuration, a waveform of an output 2201 of the power amplifier becomes a distorted waveform which is not the sinusoidal wave. A spectrum of the output of the power amplifier is shown in FIG. 24. There, in order for the signal outputted from the antenna to satisfy the radio standard, harmonic components 2f0, 3f0 . . . are required to be attenuated, and for this, harmonic components have to be removed by using a band transmission filter 2214 with a good harmonic component reduction performance. Further, in order to enhance the harmonic component reduction performance of the band transmission filter 2214, an LC filter having higher order (or using an element having a higher Q value) is required, and this leads to an increase in the number of parts, which has been a cause of increase in mounted area and cost.

Aside from this, as a power amplifier which can realize a low voltage operation without using an analog circuit and a passive element for the amplifier, there is an inverter type power amplifier configured with an NMOS transistor M242 and a PMOS transistor M241 as shown in FIG. 37.

In a case of this configuration, a waveform of the amplifier output 2401 becomes close to a pulse wave. Since the frequency components contained in the pulse wave are mainly a carrier frequency and odd harmonic component, it shows a frequency spectrum of the amplifier output signal as shown in FIG. 38, so there is such an effect that an even harmonic component is suppressed compared to the case of the configuration shown in FIG. 36. However, in the case of FIG. 38 described above, odd harmonic component is not suppressed, so there has been such a problem that a band transmission filter 2414 with a good harmonic component reduction performance is always required, as is the case with the configuration shown in FIG. 35.

As a cause of a harmonic distortion, a nonlinearity is cited. With this, transistor characteristics (gain, series resistance, and the like) are varied according to amplitudes of an input signal and an output signal. As a measure against this, an amplifier parallelization technique, with which a plurality of amplifiers are selectively operated, and when a required output amplitude is changed, it is responded without changing an input amplitude so as not to generate a harmonic distortion, has been known. For example, Japanese Patent Application Laid-Open No. 62-217708 (Patent Document 1) describes a technique which can obtain an output signal with low distortion when a large output amplitude is required, not by increasing input amplitude of each amplifier, but by increasing the number of amplifiers to be operated from among the amplifiers connected in parallel instead of increasing input amplitude.

Further, a constant amplitude wave synthesizing type amplifier of LINC (LINEAR AMPLIFICATION WITH NONLINEAR COMPONENTS) type disclosed in IEEE, COM-22, P1942 (Non-Patent Document 1), Japanese Patent Application Laid-Open No. 1-284106 (Patent Document 2), and the like, employs a method with which two power amplifiers 2601 and 2602 having the same size are connected in parallel, and phases S1 and S2 of input signals 2603 and 2604 inputted to them are changed and added, so as to change the output amplitude of the synthesized signal.

In this case, the amplitude is maximized when the phases S1 and S2 of the input signals 2603 and 2604 are equal, and this time, the amplitude of the output becomes twice the output amplitude of each power amplifier. Meanwhile, when the phases S1 and S2 are shifted by 180 degrees from each other, a sum of the output amplitudes becomes zero. Therefore, the output signal with low distortion can be obtained without increasing input amplitude of each amplifier with this method.

However, since the techniques used in these methods are specialized to suppress a sharp increase in harmonic distortion generated when the output amplitude is increased, it is not possible to suppress harmonic distortion according to the power amplifier itself, which is generated regardless of the output amplitude, such as a distortion due to odd harmonics in the waveform of the output from the power amplifier at the time of inputting the pulse wave described above. Therefore, in order to suppress such harmonics, the band transmission filter with a good performance has been still required.

Patent Document 1: Japanese Patent Application Laid-Open No. 62-217708
Patent Document 2: Japanese Patent Application Laid-Open No. 1-284106
Non-Patent Document 1: IEEE, COM-22, P1942

DISCLOSURE OF THE INVENTION

Problems to be Solved by the Invention

The sinusoidal wave input type power amplifier described above requires an analog circuit for a sinusoidal wave generating circuit, and there have been such problems that the circuit becomes complicated and an operation voltage cannot be lowered. On the other hand, with regard to the pulse input type power amplifier which can operate at low voltage and low power, there have been such problems that, since harmonic component is generated in the amplifier output, the band transmission filter with a good performance is required in order to suppress the harmonics, and for that, an LC filter with a higher order is required, thus the number of parts increases, which becomes a cause of increase in mounted area and cost. Further, a method which uses an off-chip filter for enhancing the performance of the band transmission filter is sometimes employed, but with this method, there is a problem of increasing chip cost and mounting cost. In addition, there is also a problem that, in a transistor amplification circuit of an integrated circuit, its operation speed and optimum values of power consumption are determined depending on the transistor size.

Object of the Invention

It is an exemplary object of the invention to provide a pulse input type power amplifying apparatus, which is a pulse input type so as to be operated at low voltage and low power and can effectively suppress the generation of harmonic component, as well as a power amplifying system, an output control method, and a control program, for improving the disadvantages of the related arts.

Means for Solving the Problems

In order to achieve the foregoing exemplary objects, an amplifying apparatus according to the invention includes two or more amplification circuits driven by different input signals that are input pulse waves of the same frequency, where
output signals from the two or more amplification circuits are synthesized to be outputted, and
duty ratios and phases of the input pulse waves are set independently.

Effect of the Invention

Since the present invention is configured to be driven in parallel with a pulse input method, an amplifying operation at low voltage and low cost is made to be possible; since the present invention is configured to synthesize and output the outputs of a plurality of amplification circuits, a degree of amplification can be set large; and at the same time, since the present invention is configured to use the pulses, whose phases are shifted from each other at the same frequency, as the input signals inputted to each of the plurality of amplification circuits, a power output having an amplified waveform close to a sinusoidal waveform, in which a generation of harmonic component is effectively suppressed, can be obtained by adequately setting a pulse width and a phase of each input signal.

BEST MODE FOR CARRYING OUT THE INVENTION

An exemplary embodiment of the invention is explained hereinafter by referring to attached drawings.

As a basic configuration, an amplifying apparatus according to an exemplary embodiment of the invention includes two or more amplification circuits driven by different input signals that are input pulse waves of the same frequency, where output signals from the two or more amplification circuits are synthesized and outputted, and duty ratios and phases of the input pulse waves are set independently, as shown in FIG. 1A, FIG. 3, FIG. 4, FIG. 8, FIG. 9A, FIG. 9C, and FIG. 15.

Further, specifically, each of the amplification circuits may be configured with a PMOS pull-up transistor and an NMOS pull-down transistor, and also, an operation and non-operation of the PMOS pull-up transistor and the NMOS pull-down transistor may be driven-controlled by a control signal.

As described above, since the exemplary embodiment of the invention is configured to be driven in parallel with a pulse input method, an amplifying operation at low voltage and low cost is made to be possible, and, since the exemplary embodiment of the invention is configured to synthesize and output the outputs of a plurality of amplification circuits, a degree of amplification can be set large. Further, by using the amplification circuit in which the pull-down transistor is configured with the PMOS transistor and the pull-up transistor is configured with the NMOS transistor, driving power and gain at the pull-up transistor side and the pull-down transistor side can be brought closer and the output waveform is brought closer to the pulse waveform, thus the even harmonics can be suppressed. Furthermore, by connecting all of the amplification circuits in parallel and setting duty ratio and phase of the input pulse wave of each amplification circuit independently, the output waveform can be brought closer to the sinusoidal waveform, thus the odd harmonic component of the output signal can be suppressed.

Also, by configuring the amplification circuit to be a pulse input type inverter, on/off operation can be controlled for each amplification circuit by the digital signal, and by adjusting the levels of the PMOS and NMOS transistors, harmonics can be suppressed to be small. Further, the level can be changed in accordance with a value requested for the output of the power amplifier.

Next, an exemplary embodiment of the invention will be explained in detail by referring to a specific example.

First Exemplary Embodiment

A first exemplary embodiment is shown in FIG. 1A, FIG. 1B, and FIG. 2. In the first exemplary embodiment shown in FIG. 1A, FIG. 1B, and FIG. 2, two amplification circuits are arranged to be operated in parallel, so as to reduce the harmonic component in the power output effectively. Here, FIG. 1A is a schematic block diagram showing a configuration of the first exemplary embodiment of the invention. Also, FIG. 2 is a waveform diagram showing a waveform and an operational timing of each part shown in FIG. 1A.

First, a pulse input type power amplifying apparatus according to the exemplary embodiment shown in FIG. 1A includes at least two amplification circuits 11 and 12, each of which is formed from a plurality of amplifiers M11 and M12, or M13 and M14, whose output sides are connected to each other, and driven at the same frequency. Among this, the plurality of amplifiers M11 and M12, forming one amplification circuit 12, is configured with a first inverting amplifier M12 inputting and amplifying a reference pulse 23, and a second inverting amplifier M11 to which an inverted pulse 22 formed by shifting and inverting the phase of the reference pulse 23 is inputted. The other amplification circuit 11 is configured with the first inverting amplifier M14 and the second inverting amplifier M13 to each of which other wide pulse 21 with a width greater than that of the reference pulse 23 is commonly inputted.

Here, the first inverting amplifier M14 and the second inverting amplifier M13 forming the other amplification circuit 12 described above may be configured so as to input the reference pulse 23 and the inverted pulse 22 formed by shifting and inverting the phase of the reference pulse 23, as the case of the plurality of amplifiers M11 and M12 forming the one amplification circuit 11.

Since at least two amplification circuits 11 and 12, formed from a plurality of amplifiers M11 and M12, or M13 and M14, are arranged to be driven in parallel with a pulse input method, an amplifying operation at low voltage and low power is made to be possible; since the outputs from the plurality of amplification circuits 11 and 12 are synthesized to be outputted, a degree of the amplification can be set large; and at the same time, since the pulses whose phases are shifted from each other at the same frequency is to be utilized as the input signals to each of the plurality of amplifiers M11 and M12, or M13 and M14, a power output having an amplification waveform close to a sinusoidal waveform, in which a generation of harmonic component is effectively suppressed by adequately setting a pulse width and a phase of each input signal, can be obtained.

Hereinafter, the exemplary embodiment will be explained in more detail.

In the first exemplary embodiment, pulse waves 22, 23, and 21 transmitted via first to third signal transmission circuits L22, L23, and L21 described later are to be inputted to respective amplifiers M11, M12, M13, and M14 as shown in FIG. 1A.

In FIG. 1A, a power amplifying unit 10 is configured with two amplification circuits 12 and 11 as described. The one amplification circuit 12 is configured such that a pull-down transistor of the first inverting amplifier is formed by an NMOS transistor M12 and a pull-up transistor is formed by a PMOS transistor M11 (inverter type amplifier). Also, the other amplification circuit 11 configures the inverter type amplifier in which an NMOS transistor M14 and a PMOS transistor M13 form the first inverting amplifier. And an output signal 15 of the power amplifying unit 10 is inputted to a band transmission filter unit 14, then an output signal of the band transmission filter unit 14 is transmitted from the antenna 16.

Here, various types of the input signals (pulse waves) are described.

Before synthesizing output waveforms described in FIG. 1A, various types of the input signals (pulse waves), whose duty ratios required for the pulse input type power amplifying apparatus are set adequately, are to be generated and outputted by a pulse wave forming device 5, in the exemplary embodiment.

The pulse wave forming device 5 includes a pulse generation circuit 5A and a pulse generation circuit 5B which performs an arithmetic processing on a pulse formed by the pulse generation circuit 5A, which is to be a reference pulse, to generate a plurality of pulses having different pulse widths and different pulse levels being required. Specifically, this pulse generation circuit 5B generates a plurality of reference signals with the same frequency based on the pulse signal outputted from the pulse generation circuit 5A.

The pulse generation circuit 5A includes a carrier signal generator 5I which generates a multi-phase carrier signal, a digital-to-analog converter 5H which converts a base band signal to a sinusoidal wave, a bandlimiting filter 5G which eliminates harmonic component of a signal outputted from the digital-to-analog converter 5H, and an analog mixer 5F which multiples the carrier signal by the sinusoidal wave to generate a modulated pulse signal. A pulse modulated signal L1 outputted from the pulse generation circuit 5A is converted to pulses L22, L23, L24, . . . which are the same in frequency but different in ratio of a time period at high-level to a time period at low-level (duty ratio), by the pulse generation circuit 5B.

At an output side of the pulse generation circuit 5B, a first signal transmission circuit L22, including an inverting circuit 5C which inverts the above described reference pulse, and a delay circuit 5D which delays the inverted pulse by 180 degrees or 45 degrees with respect to the above described reference pulse and outputs the pulse as a pulse wave 22, is arranged.

A referential mark L23 indicates a second signal transmission circuit arranged at the output side of the pulse generation circuit 5B. This second signal transmission circuit L23 transmits the reference pulse formed by the pulse generation circuit as it is, as a pulse wave 23.

Also, a referential mark L21 indicates a third signal transmission circuit arranged at the output side of the pulse generation circuit 5B. This third signal transmission circuit L21 transmits a wide pulse signal formed by the pulse generation circuit 5B, whose width is set adequately greater than that of the reference pulse, as a pulse wave 21.

Further, the pulse generation circuit 5B described above forms and outputs a required pulse wave, such as a plurality of pulse waves with different pulse widths, a plurality of pulse waves with different levels, and a plurality of pulse waves with different timings, with complete control, as needed in the various types of the amplification circuits.

Also, each of the first to third signal transmission circuits L22, L23, and L21 described above is provided with a timing adjusting circuit 5E which changeably sets the timing at which the pulse wave rises or falls, independently.

Therefore, the pulse wave forming device 5 described above is capable of responding to the desired input pulse wave as required for not only the pulse input type power amplifying apparatus according to the exemplary embodiment, but also a pulse input type power amplifying system and the like according to other exemplary embodiments described later which are different from this exemplary embodiment. At the same time, even when the timings between the first to third signal transmission circuits L22, L23, and L21 are varied due to a processing variation or the like, the timing adjusting circuit 5E can correct the timings.

Here, another example of the pulse wave forming device 5 described above is further explained in detail referring to FIG. 21 to FIG. 40.

First, the pulse wave forming device 5 shown in FIG. 21 includes a pulse generation circuit 5A, an N-phase signal generation circuit 2802 which converts a pulse modulated signal L1 to an N-phase signal, a duty conversion circuit 2801 which generates pulse waves 21, 22, and 23 from the N-phase signal.

The duty conversion circuit 2801 is configured with a logic circuit as shown in FIG. 23. An operation thereof will be shown as a timing chart in FIG. 22. Here, a six-phase signal is used as an example. A first signal S1 is referred to as a pulse wave 21. The time period at high-level of the pulse wave 21 is a period from 0 to $(1/2) \times T0$. When a second signal S2 and a third signal S3 are passed through the logic circuit shown in FIG. 23, the waveform thereof becomes to be a waveform of a pulse wave 23 shown in FIG. 22. The time period at high-level of this waveform is a period from $(1/6) \times T0$ to $(2/6) \times T0$. When a fifth signal S5 and a sixth signal S6 are passed through the logic circuit shown in FIG. 23, the waveform thereof becomes to be a waveform of a pulse wave 22 shown in FIG. 22. The time period at low-level of this waveform is a period from $(4/6) \times T0$ to $(5/6) \times T0$.

An N-phase clock conversion circuit 2802 is configured with N number of phase interpolators 3101 as shown in FIG. 24. When integer values "a" and "b" are provided as digital data, the phase interpolator outputs an output signal CLK[0] which rises at a timing determined in such a manner that a time difference between the timings at which two input signals CLK[i] and CLK[i+1] rise is divided at a ratio of b:a, as shown in FIG. 25.

Among the four-phase clock to be inputted, by inputting two signals whose phases are adjacent to each of the N number of phase interpolators and setting values "a" and "b" adequately, an N-phase clock in which phase differences from adjacent phases become 360/N degrees is outputted as an output signal. For example, in order to output six-phase clock, by only setting the values as shown in FIG. 24, six-phase clock each of whose phase is shifted by 60 degrees from adjacent phases is outputted.

A configuration example of the phase interpolator is shown in FIG. 26. It is configured such that a dynamic circuit and a constant current supply circuit are combined, and, by setting the number of signals to be set at high-level from among N-bit control signals CT1[1], CT1[2], CT1[3], ..., CT1[N] as "a", a current value (aI) flown from a transistor M1 at a time when the first input signal "CLK[i]" is at high-level is determined, and also, by setting the number of signals to be set at high-level from among N-bit control signals CT2[1], CT2[2], ..., CT2[N] as "b", a current value (bI) flown from a transistor M2 at a time when the second input signal "CLK[i+1]" is at high-level is determined. With this method, a clock CLK[0] having the delay time specified by dividing a time difference between the timings at which two input signals rise at a ratio of b:a.

In cases of configurations shown in FIG. 1B and FIG. 21, an analog mixer 5F for converting a carrier signal to a pulse modulated signal L1, a digital-to-analog converter 5H for generating a sinusoidal wave to be inputted to the analog mixer, and a bandlimiting filter 5G are additionally used in practice. Therefore, the configuration is being such as shown in FIG. 27. As shown in FIG. 27, in order to add a function of performing a phase conversion of the carrier signal in accordance with a baseband signal to the N-phase signal generation circuit, a phase modulation signal generation circuit 3401 which controls a phase modulation signal controlling the N number of phase interpolators within the N-phase signal generation circuit is provided. And, by switching the phase modulation signal at each timing at which a phase switching clock rises, the phase of the N-phase signal outputted from the N-phase signal generation circuit 3402 can be switched at each timing at which the phase switching clock rises.

A configuration of the N-phase signal generation circuit 3402 is shown in FIG. 28. It is configured such that, in addition to the configuration shown in FIG. 24, digital data (a, b) for controlling the N number of phase interpolators can be switched by the phase modulation signal, and the clock to be inputted into each of the N number of phase interpolators can be switched by a selector circuit 3501. The selector circuit 3501 selects and outputs two out of four input signals in accordance with the phase modulation signal.

When the phase modulation signal is "1", CLK1 is outputted as a first output, and CLK2 is outputted as a second output. When the phase modulation signal is "2", CLK2 is outputted as a first output, and CLK3 is outputted as a second output. When the phase modulation signal is "3", CLK3 is outputted as a first output, and CLK4 is outputted as a second output. When the phase modulation signal is "4", CLK4 is outputted as a first output, and CLK1 is outputted as a second output.

In FIG. 28, six-phase clock having phases of 0 degree, 60 degrees, 120 degrees, ..., 300 degrees, is outputted. FIG. 29A shows a combination of the phase modulation signals when all of the phases of the six-phase clock are switched by 15 degrees. On the other hand, FIG. 29B shows a combination of the phase modulation signals when all of the phases of the six-phase clock are switched by −15 degrees. In each case of FIGS. 29A and 29B, phase differences between each phase of the six-phase clock are kept at 60 degrees.

As described above, by specifying the phase modulation signal adequately, it becomes possible to switch all of the phases of the N-phase clock while keeping phase differences between each phase of the N-phase clock.

As a transmission signal method for a radio communication system, there is a phase modulation method of increasing phase differences of a transmission signal with respect to a carrier signal at a certain rate at regular time intervals when a baseband signal is 1, and decreasing phase differences of a transmission signal with respect to a carrier signal at a certain rate at regular time intervals when a baseband signal is 0.

A time change in a phase relation between the carrier signal and a pulse wave 21 when the phase of the carrier signal is modulated by the method of FIG. 21 is shown in FIG. 30, and a time change in a phase relation between the carrier signal and a pulse wave 21 when the phase of the carrier signal is modulated by the method of FIG. 27 is shown in FIG. 31.

Here, in FIG. 30, it is found that the digital-to-analog converter 5H outputs an adequate sinusoidal wave phase according to the baseband signal, and the phase difference of the pulse wave 21 with respect to the carrier signal is smoothly increased at each cycle in accordance with the change in a value of the sinusoidal wave. Therefore, it is found that a smooth phase modulation without having the harmonic component has been realized.

On the other hand, in FIG. 31, a value of digital data is switched at every timing at which the phase switching clock rises, and the phase of the pulse wave 21 is shifted accordingly. At this time, if the phase switching clock is risen at every carrier frequency, and if the phase modulation signal is switched adequately, the phase difference of the pulse wave 21 with respect to the carrier signal can be increased at every cycle, as the result of FIG. 30.

Also, it is found that, when the cycle of the phase switching clock is set to be R times the carrier frequency and the phase change amount of the pulse wave 21 at the time of rising of the phase switching clock is increased to R times that of the case with the setting shown in FIG. 30, as shown in FIG. 31, the phase difference is changed at every R cycle, but the phase modulation can be achieved at the same phase change rate (phase change amount per unit time) as that of the case shown in FIG. 30 in which the phase is changed at every cycle, as shown in a graph of FIG. 31.

Effects obtained at a time when the frequency of the phase switching clock is lowered than the carrier frequency are that the operational frequency of the phase modulation signal generation circuit 3401 can be lowered, design is facilitated, and power can be reduced. Also, with the phase modulation method shown in FIG. 30, it is required for the N-phase generation circuit to adjust the phase of the N-phase clock at every $\Delta\theta$, but with the phase modulation method shown in FIG. 31, it is only required for the N-phase generation circuit to adjust the phase of the N-phase clock at every "R×$\Delta\theta$". Therefore, the number of bits of a phase adjusting circuit shown in FIG. 26 can be reduced to 1/R.

In the case of the method shown in FIG. 31, since a timing of the N-phase clock generation is adjusted at every phase switching clock, the frequency component of the phase switching clock is possibly propagated to the output signal of the power amplifier.

FIG. 32 shows a power spectrum of the output signal of the power amplifier when the phase switching clock is set to be 40 [MHz] using the method shown in FIG. 31. It is found that a peak of the power spectrum is located at, in addition to the carrier frequency, a frequency which is separated by 40 [MHz] from the carrier frequency. However, from this drawing, it is seen that the peak of the power spectrum generated at the frequency which is separated by 40 [MHz] from the carrier frequency is suppressed to the level lower than the power spectrum of the carrier frequency by 30 [dB] or more, therefore the value can be seen as being settled in a range with no problem if the radio standard is not so strict. Further, the peak can be lowered more by spreading the spectrum, by increasing the cycle of the phase switching clock, or, by modulating the cycle of the phase switching clock by $\Delta\theta$.

Next, the power amplifier unit 10 described above is explained.

First, the other amplification circuit 11 configuring a part of the power amplifier unit 10 is inputted with a pulse wave 21 which repeats the cycle at a duty ratio of 50% and frequency of F0. At this time, a ratio of the transistor sizes of the PMOS transistor M13 and the NMOS transistor M14 is set such that an even harmonics of the amplifier output becomes small.

Also, as a signal to be inputted to the one amplification circuit 12 configuring a part of the power amplifier unit 10, a pulse wave 22 which becomes ON at a timing of midpoint of the time period during which the PMOS transistor M13 operates is inputted to the PMOS transistor M11, and a pulse wave 23 which becomes ON at a timing of midpoint of the time period during which the NMOS transistor M14 operates is inputted to the NMOS transistor M12.

When a timing at which the pulse wave 21 rises is set as a reference (time "0") and S represents a cycle of the pulse wave 21, a time during which the pulse wave 21 is at high-level ranges from 0 to (1/2)S. When T represents a time during which the pulse wave 21 is at low-level, the period ranges from [(3/4)S−(T/2)] to [(3/4)S+(T/2)], and a time period during which the pulse wave 23 is at high-level ranges from [(1/4)S−(T/2)] to [(1/4)S+(T/2)].

Compared to each of a region 1 and a region 3 where only the one amplifier circuit 12 operates, the number of PMOS transistors and NMOS transistors to operate is increased in a region 2 where the both amplifiers operate, so the driving power and the gain are increased, and the output of the power amplifier unit 10 (amplifier output 15) changes in a staircase pattern as shown in FIG. 2.

At this time, since the waveform of the amplifier output can be brought closer to a sinusoidal waveform by adequately setting a ratio between the transistor size of the other amplifier circuit 11 and the transistor size of the one amplifier circuit 12, the odd harmonics can be effectively reduced compared to the case of the power amplifier shown in FIG. 33 with which the waveform of the amplifier output is in a pulse shape.

Further, by using the amplifier in which the pull-down transistor is formed with the NMOS transistor and the pull-up transistor is formed with the PMOS transistor, the driving power and the gain on the pull-up transistor side and the pull-down transistor side are brought closer to each other, compared to a traditional case of using an inductor for the pull-up transistor. Therefore, the output waveform becomes closer to the pulse wave, and the even harmonics can be reduced more effectively.

Second Exemplary Embodiment

A second exemplary embodiment is shown in FIG. 3. In the second exemplary embodiment shown in FIG. 3, a so-called multi-parallel amplification circuit for reducing the harmonics in which two amplifiers are parallelized is presented.

In the second exemplary embodiment, the above described one amplifier circuit 12 of the first exemplary embodiment is configured with at least a first and a second amplification circuits 33 and 32 which are configured to be equivalent. Among them, the first amplification circuit 33 is configured with a first inverting amplifier M33A to which a reference pulse is inputted and a second inverting amplifier M33B to which an inverted pulse formed by shifting and inverting the phase of the reference pulse is inputted. Also, the second amplification circuit 32 is configured with a first inverting amplifier M32A to which a second reference pulse with a width greater than that of the reference pulse is inputted and a second inverting amplifier M32B to which an inverted pulse formed by shifting and inverting the phase of the second reference pulse is inputted.

Also, the other amplification circuit 11 of the first exemplary embodiment described above is provided as other amplification circuit 31 in the second exemplary embodiment. And the other amplification circuit 31 configures an inverter type amplifier in which the first inverting amplifier is formed by the NMOS transistor M31A and the PMOS transistor M31B, as the case of the above described other amplification circuit 11, and equivalently functions as the above described other amplification circuit 11. The other configurations and effects are the same as those of the exemplary embodiment shown in FIG. 1.

With this, there is such a merit that a waveform of the output, which is the synthesized power outputs from the entire power amplifying apparatus, can be made to be a waveform closer to a sinusoidal waveform in which the harmonic is effectively suppressed, and the power amplifying apparatus whose output has a waveform closer to a sinusoidal waveform and whose output power is large can be obtained since the amplification circuit is a multi parallel type.

That is, the second exemplary embodiment shown in FIG. 3 uses three inverter type amplifiers 31, 32, and 33 to synthesize the pulse waves 41-44 for forming an amplifier output 35.

When the number of inverter type amplifiers is increased to three or more, such as 31, 32, 33, . . . , the operational timing of each amplifier can be set more finely each other by adequately setting the transistor size of each amplifier and changing the duty ratio. Consequently, the waveform of the output from the amplifier can be brought closer to be a sinusoidal waveform further, as a waveform shown in FIG. 3.

Like this, since the waveform of the output can be brought closer to be a sinusoidal waveform further by connecting a plurality of amplification circuits in parallel, each of which is formed by two amplifiers, and setting each of the duty ratio and the phase of the input pulse wave of each amplification circuit independently, the odd harmonic component of the output signal can be also suppressed.

Third Exemplary Embodiment

A third exemplary embodiment is shown in FIG. 4 and FIG. 5. In the third exemplary embodiment shown in FIG. 4 and FIG. 5, it is intended to reduce the harmonics by parallelizing the amplifiers which are the same in duty ratio and different in operational timing.

In the FIG. 4, the pulse input type power amplifying apparatus includes at least two amplification circuits 42 and 41 each of which is formed by a plurality of amplifiers whose output sides are connected to each other and driven at the same frequency.

Among them, one amplification circuits 42 is configured with a plurality of amplifiers, i.e., a first inverting amplifier M52 to which a reference pulse 62 is inputted and a second inverting amplifier 51 to which an inverted pulse 63 formed by shifting the phase of the reference pulse 62 by 180 degrees is inputted to be inverted and amplified. Also, the above described other amplification circuit 41 is configured with a plurality of amplifiers, i.e., a first inverting amplifier M54 to which a reference pulse 64 is inputted and a second inverting amplifier M53 to which an inverted pulse 65 formed by shifting the phase of the reference pulse 64 by 180 degrees is inputted to be inverted and amplified.

Further, this exemplary embodiment has such a feature that the reference pulse 64 inputted into the first inverting amplifier M54 forming the other amplification circuit 41 is being a reference pulse generated by forwarding the phase of the reference pulse 62 inputted into the first inverting amplifier M52 forming the one amplification circuit 42 by 45 degrees (see FIG. 5).

With this, input signals which are the same in pulse width and different in rising phase are inputted into the plurality of amplification circuits 42 and 41 each of which is formed by the plurality of amplifiers. Therefore, a large power output whose waveform is a sinusoidal waveform can be obtained without using input signals with a plurality of pulse widths, and thus the output waveform can be brought closer to a sinusoidal waveform whose harmonics are effectively suppressed.

Here, in the third exemplary embodiment, the transistor sizes of the transistors in the other amplification circuit 41 and the one amplification circuit 42 are designed such that the sizes of M51 and M53 are to be the same, and the sizes of M52 and M54 are to be the same. The other configurations and effects are the same as those of the first exemplary embodiment shown in FIG. 1 described above.

In the first exemplary embodiment, the operating time of the first inverting amplifier M14 is set to be (1/2) f0 as shown in FIG. 2. On the other hand, in the third exemplary embodiment (FIG. 5), when a time from which the first inverting amplifier M54 starts to operate is set as a reference (set to be "0") and a time during which a pulse wave 64 is to be ON to operate the first inverting amplifier M54 is set to be from 0 to T (T<1/2f0), by setting a time during which a pulse wave 62 is to be ON to operate the first inverting amplifier M52 is set to be (1/2)f0~(T~1/2)f0 (Here, "T~1/2" means "from T to 1/2"), the driving power and the gain are increased in a region 2 where the both amplifiers operate compared to each of a region 1 and a region 3 where only the one amplifier operates, as shown in FIG. 2, and the waveform closer to a sinusoidal waveform can be outputted.

As a merit of the third exemplary embodiment, there is such a feature that, since the duty ratio of the pulse wave shown in FIG. 5 is close to 50%, it can be driven with the waveform not being deformed even when the buffer for driving the pulse wave is weak, compared to the pulse wave of the first exemplary embodiment shown in FIG. 2.

Fourth Exemplary Embodiment

A fourth exemplary embodiment is shown in FIG. 6-FIG. 9. In the fourth exemplary embodiment shown in FIG. 6-FIG. 9, it is intended to optimize the output waveform by digitally controlling the output intensity of the pulse input type amplifying apparatus as the power amplifier.

That is, in the pulse input type amplifying system according to the fourth exemplary embodiment, the power amplifier 80 as a power amplifying apparatus includes at least one and other amplification circuit groups 80A and 80B each of which is provided with a plurality of amplification circuits whose output sides are connected to each other and driven at the same frequency.

Among them, the other amplification circuit group 80B is configured with a plurality (three) of amplification circuits 806, 805, and 804, as digital control amplification circuits connected in parallel for two different input signals, and each of which has two input signal terminals. Also, one amplification circuit group 80A is configured with a plurality (three) of amplification circuits 803, 802, and 801 as digital control amplification circuits, connected in parallel for a same input signal, and each of which has two input signal terminals. Here, the amplification circuits 802-806 are configured to be the same as the above described amplification circuit 801.

And each of the above described amplification circuits 801-806 is provided with an amplifying operation executing function of, being activated independently in accordance with digital control signals (specifically, on/off operation selecting signals) SEL91-SEL96 as select signals from outside, executing an amplifying operation according to the select signals SEL91-SEL96.

Since at least two amplification circuit groups 80A and 80B which are driven in parallel by inputting pulse are provided, the amplifying operation at low voltage and low power can be realized; since the outputs of amplification circuits are synthesized to be outputted, the degree of the amplitude can be set large; since the pulses whose phases are shifted from each other at the same frequency is to be used as the input signals to each of the plurality of amplification circuits (digital control amplification circuits) 801-806, and at the same time, each of the amplifiers forming the plurality of amplification circuits 801-806 can be selected and driven independently for on/off operation by the select signals SEL91-SEL96 from outside, the power output of the amplification system can be adjusted with complete control, so the power output having an amplification waveform close to the sinusoidal waveform, in which a generation of harmonic component is effectively suppressed by adequately setting a pulse width and a phase of each input signal, can be obtained.

Here, the other amplification circuit group 80B described above may be configured to have a second amplification level outputting function of variably outputting the amplification level for the time of operating at a duty ratio of 50% or less.

Also, the one amplification circuit group 80A described above is configured to have a first amplification level outputting function of variably outputting the amplification level for the time of operating at a duty ratio of 50%.

With this, a waveform of the power output by the amplifying system can be made to be a waveform closer to a sinusoidal wave, and the generation of the harmonics can be more effectively suppressed.

This will be explained further in detail. The amplification circuit 801, as a digital control circuit, is shown in FIG. 6. The amplification circuit 801 shown in FIG. 6 and in FIG. 7 functions so as to operate in accordance with the level of the input signals INP, INN when the select signal (on/off operation control signal: SEL signal) is at high-level, and functions such that the power amplifier is always turned off when the select signal (SEL signal) is at low-level.

A specific example of the amplification circuit 801 is shown in FIG. 7. In this FIG. 7, a gate of the PMOS transistor WP1 of the amplification circuit 801 is operated by an output of an OR circuit 1301 to which an input signal INP and an inverted signal of the select signal (SEL signal) are inputted. Also, the NMOS transistor WN1 of the amplification circuit 801 is operated by an output of an AND circuit 1303 to which an input signal INN and the select signal (SEL signal) are inputted.

Here, when the SEL signal is at high-level, the transistors WP1 and WN1 are to be an ON state according to input signals INP and INN. When the SEL signal is at low-level, the output of the OR circuit 1301 is at high-level and the AND circuit 1303 is at low-level, and both of the transistors WP1 and WN1 are always being an OFF state.

With this method, when the select signal SEL is at low-level, direct-current flown from a power line can be suppressed completely.

An exemplary embodiment specified as an amplifying system by parallelizing the amplification circuit 801 is shown in FIG. 8. Here, the amplification circuits 802-806 are configured to be equivalent to the amplification circuits 801 described above.

In FIG. 8, the digital control amplification circuits 801, 802, and 803 configure the one amplification circuit group 80A as described above. Each of the digital control amplification circuits 801-803 is driven by pulse wave 81, being input signal, as shown in FIG. 8. Also, each of the amplification circuits 801-803 is on/off controlled by digital control signals SEL91, SEL92, and SEL93 being select signals.

On the other hand, the digital control amplification circuits 804, 805, and 806 configure the other amplification circuit group 80B as described above. Each of the digital control amplification circuits 804-806 is driven by pulse waves 82 and 83, being input signals, as shown in FIG. 8. Also, each of the digital control amplification circuits 804-806 is on/off controlled by the digital control signals SEL94, SEL95, and SEL96 being select signals.

By controlling the pulse wave 81 using the digital control signals SEL91-SEL93 being select signals, the level of the amplifier which operates at a duty ratio of 50% can be controlled in the one amplification circuit group 80A. At the same time, by controlling the pulse waves 82 and 83 using the digital control signals SEL94-SEL96 being select signals, the level of the amplifier which operates at a duty ratio of 50% or less can be controlled in the other amplification circuit group 80B.

Here, as a setting method of the select signals (digital control signals) SEL91-SEL93 described above in FIG. 8, there is a method with which the waveform of the output from the entire power amplifier (amplifying system) is observed directly using an oscilloscope, and an operator inputs from outside based on the observed waveform. In addition, the setting may be performed depending on a spectrum measuring circuit 2801 which measures a spectrum of an output of the band transmitting filter 84 or an input unit of the antenna 86.

Also, as shown in FIG. 9A, there may be provided an operation control circuit 2802 which can automatically set the select signals (digital control signals) SEL91-SEL96 for on/off operation in response to output information of the amplifying apparatus according to a preset program, thereby an optimum waveform output and a targeted output level are automatically set. Note that the spectrum measuring circuit 28C1 can be realized by an off-chip spectrum analyzer or an on-chip waveform measuring circuit.

Further, as shown in FIG. 9C, there may be provided a current measuring circuit 2803 which measures current of each of NMOS and PMOS transistors, which has the same transistor length as each of NMOS and PMOS transistors used in the digital control amplification circuits 801-806, instead of the spectrum measuring circuit 2801, and SEL91-SEL96 may be automatically set according to the measured current value of each of NMOS and PMOS transistors.

In this case, when input pulse waves 81, 82, and 83 which operate at a frequency f0 are inputted and a spectrum of an output of the band transmitting filter 84 or an input unit of the antenna 86 is measured by using a spectrum measuring circuit 2801, a frequency spectrum as shown in FIG. 21 can be obtained, for example.

At this time, it is judged whether the power level of a carrier frequency (f0) component is being a desired value, and whether the power level of the harmonic component is being under the desired values. If either one of the values is not reached to the desired value, on or off of each signal is switched and the above described judgment is repeated, thus a desired output characteristic can be realized.

In the above described first exemplary embodiment shown in FIG. 1, it is required that the transistor size be designed in an optimized manner in advance, in order to bring the waveform of the output of the amplifier closer to the sinusoidal waveform with less harmonic component. On the other hand, in the fourth exemplary embodiment, by resetting the control signal to a proper value after the design, the level of the power amplifier can be set proper even when there are influences of variation in transistor size or driving power per unit transistor width.

For example, as shown in FIG. 10, when an actual waveform is closer to the pulse waveform than the sinusoidal waveform, the waveform of the output from the amplifier can be brought closer to the sinusoidal waveform with less harmonic component, by setting the values of the digital control signals SEL94, SEL95, SEL96 so as to rise the level of the digital control amplification circuits 804, 805, and 806 which have smaller duty ratios.

Further, with a configuration shown in FIG. 8, it is possible to correspond to an amplitude modification method of performing date communication, by changing the output amplitude according to a value of data.

FIG. 12 shows an outline of the amplitude modification. A control of the amplitude of power amplifier output OUT is attained by controlling the select signal SEL dynamically. For maximizing the amplitude, all of the select signals SEL are set to be high-level. For lowering the amplitude a little, SEL93 and SEL96 of the select signals are set to be off. For lowering the amplitude further, SEL95 and SEL92 are further set to be off. When all of the select signals SEL are set to be off, the power amplifier is turned off and it becomes a shut down state in which no current is flown.

With the power amplifier (amplifying system) in general, when changing the output power, it has been done by controlling and switching the source voltage. However, the method of the fourth exemplary embodiment is characterized in that it is not required to switch the source voltage for switching the output power.

The operation control circuit 2802 described above is further described hereinafter in detail.

In FIG. 9A, the one and the other amplification circuit groups 80A and 80B are provided with the operation control circuit 2802, as a common operation control circuit, which controls the operation of each of the amplification circuits 801-806 independently.

Also, the operation control circuit 2802 is provided with a spectrum detecting circuit 2801 which detects information according to the waveform of an output signal 85 outputted to outside from the common output line 80a, and in addition, the operation control circuit 2802 has a function of, being activated based on the detection information sent from the spectrum measuring circuit 2801, generating a select signal (on/off operation select signal) which is a drive instruction corresponding to each of the amplification circuits 801-806 with which the waveform and the output level of the amplified output signal 85 become preset waveform and output level, and sending the select signal to each of the amplification circuits independently. The other configurations and its operations and effects are the same as those of the first exemplary embodiment described above (see FIG. 1).

Subsequently, an entire operation of the fourth exemplary embodiment described above is explained based on FIG. 9B.

First, prior to the operation of the power amplifier unit 80 described above, a reference clock is created at the pulse generation circuit 5B described above (see FIG. 1) based on a pulse signal inputted from the pulse oscillator 5A (step S101). Next, based on the reference clock, logic operation processing such as logical addition (OR), AND operation (AND), and NOT operation (NOT) are performed to generate a plurality of pulse waves (pulse input signals) which are different in pulse widths and rising phases (stop S102).

When pulse waves 82 and 83 suitable for synthesizing an objected signal waveform are selected from the generated plurality of input signals (pulse waves) and inputted to the power amplifier unit 80 described above, the inputted signals are amplified and added at the output side of the power amplifier unit 80.

That is, two of the different input signals having the same frequency are inputted at the same time into a plurality of digitally-controlled amplification circuits 804 which are connected in parallel, to be amplified; and other two of the same input signals having the same frequency are inputted, simultaneously with the above described two different input signals, into a plurality of digitally-controlled amplification circuits 805 and 806, each of which has two input terminals and connected in parallel, to be amplified (step S103: first step). Here, other two of the different input signals having the same frequency may be inputted into the plurality of amplification circuits 805 and 806 independently at the same time.

The input signals amplified by the amplification circuits 804-806 are synthesized at the output side and outputted outside as a power amplifier output via a common output line (step S104: second step, input signal adding step).

The waveform and the output level of the amplifier output being outputted outside is detected as output power information by a prescribed output detecting device (such as the spectrum measuring circuit 2801) (third step).

An operation control unit 2802, provided in advance, is activated according to the detected output power information and controls the amplifying operation of each of the amplification circuits 804-806 independently in such a manner that the waveform and the output level are made to be an objected waveform and an objected output level (fourth step).

Here, in the fourth step described above, at controlling each of the amplification circuits 804-806 independently, the operation control circuit 2802, being activated when the detection information which is the output power information described above is inputted, generates a select signal corresponding to each of the amplification circuits 804-806 independently with which the waveform and the output level of the output are amplified based on the detection information to be preset objected waveform or objected output level, and sends the select signal to each of the amplification circuits independently.

With this, if the synthesized waveform being obtained meets the purpose well compared to the objected signal waveform, the procedure ends. If the waveform does not meet the purpose well, the procedure returns to step 5103 again and repeats the following steps (step S105). Here, following the step S103 and prior to the step S104, a step of finely adjusting the level and the phase of each input signal (step S106) may be provided. Such judgment and fine adjustment described above are executed by the operation control circuit 2802. Further, each of the input signals generated at step S102 may be the same in pulse width, and different in rising phase only.

Thus, by executing processes described above and adding the plurality of pulse input signals, it becomes possible to synthesize the objected signal waveform.

As described above, with the fourth exemplary embodiment, the amplifying operation at low voltage with low power can be realized and the degree of the amplitude can be set larger as in the case of the first exemplary embodiment, and at the same time, since each on/off operation of the amplifiers forming each of amplification circuits can be selected and driven independently by the operation control circuit 2802 using the select signals from outside, the output level of the entire synthesized output can be adjusted to a preset level with complete control by adequately setting the on/off operation of each amplifier. With this, the power output having an amplification waveform close to a sinusoidal waveform, in which a generation of harmonic component is effectively suppressed, can be obtained by adequately setting the on/off operation of each amplifier according to an operation program presetting the pulse width and the phase of each of the input signals.

Here, with respect to the entire operation of each configuring portions in the fourth exemplary embodiment, it is also acceptable to construct the executing process content in each step described above as a program, and to cause a computer to perform those programs.

Even with this, as in the case of the fourth exemplary embodiment, a content of each step can be executed and processed so as to obtain the output having the amplified waveform close to a sinusoidal waveform, in which a generation of harmonic component is effectively suppressed, to attain the object of the invention.

Fifth Exemplary Embodiment

Next, a fifth exemplary embodiment will be described based on FIG. 13 to FIG. 17.

In the fifth exemplary embodiment shown in FIG. 13 to FIG. 17, it is intended to optimize the waveform by digitally controlling the level of the power amplifier with the PMOS transistor and the power amplifier with the NMOS transistor more independently. An amplification circuit 1201 as a digital control circuit provided in the fifth exemplary embodiment is shown in FIG. 13.

In the amplification circuit 1201 of the fifth exemplary embodiment, the PMOS transistor WP2 of the amplification circuit 1201 is operated according to the level of the input signal INP when the select control signal SELP is at high-level, and the NMOS transistor WN2 of the amplification circuit 1201 is operated according to the level of the input signal INN when the select control signal SELN on the NMOS transistor side is at high-level. And the amplification circuit 1201 is always turned off when both of the select control signals SELP and SELN are at low-level. FIG. 14 is a specific circuit diagram realizing FIG. 13.

A gate of the PMOS transistor WP2 of the amplification circuit (power amplifier) 1201 shown in FIG. 13 and FIG. 14 is operated by an output of an OR circuit 1301 based on an input signal INP and an inverted signal of the select signal SELP. Also, the NMOS transistor WN2 of the amplification circuit (power amplifier) 1201 is operated by an output of an AND circuit 1303 based on an input signal INN and the select signal SELN.

Also, when the SELP signal is at high-level, the transistor WP2 is to be ON-state according to a level of the input signal INP, and when the SELN signal is at high-level, the transistor WN2 is to be ON-state according to a level of the input signal INN.

On the other hand, when the SELP signal is at low-level, the output of the OR circuit 1301 is at high-level, and when the SELN signal is at low-level, the output of the AND circuit 1303 is at low-level, and both of the transistors WP2 and WN2 are always to be OFF-state.

An example using the amplification circuit 1201 being parallelized is shown in FIG. 15.

In FIG. 15, the amplification circuits 1401, 1402, and 1403 as the digital control amplifiers, configuring the one amplification circuit group 140A, are driven by the pulse wave 141 which is equivalent to the pulse wave 21 shown in FIG. 2, and at the same time, controlled independently by each two digital control signals, SEL151N and SEL151P; SEL152N and SEL152P; and, SEL153N and SEL153P.

On the other hand, the amplification circuits 1404, 1405, and 1406 as the digital control amplifiers, configuring the other amplification circuit group 140B, are driven by the pulse waves 142 and 143 which are equivalent to the pulse wave 22 shown in FIG. 2, and at the same time, controlled independently by each two digital control signals, SEL154N and SEL154P; SEL155N and SEL155P; and, SEL153N and SEL153P.

The output level on the NMOS transistor side of each of the amplification circuits 1401, 1402, and 1403 driven by the pulse wave 141 can be controlled by variably setting the contents controlled by the digital control signals SEL151N, SEL152N, and SEL153N from outside adequately.

On the other hand, the output level on the PMOS side of each of the amplification circuits 1401, 1402, and 1403 driven by the pulse wave 141 can be controlled by variably setting the contents controlled by the digital control signals SEL151P, SEL152P, and SEL153P from outside adequately.

Also, the output level on the NMOS transistor side of each of the amplification circuits 1404, 1405, and 1406 driven by the pulse wave 143 which is equivalent to the pulse wave 23 shown in FIG. 2 can be controlled by variably setting the contents controlled by the digital control signals SEL154N, SEL155N, and SEL156N from outside adequately.

On the other hand, the output level on the PMOS side of each of the amplification circuits 1404, 1405, and 1406 driven by the pulse wave 142 can be controlled by variably setting the contents controlled by the digital control signals SEL154P, SEL155P, and SEL156P from outside adequately.

The other configurations are the same as those of the fourth exemplary embodiment described above.

Since the fifth exemplary embodiment is configured as described above, it has the same operations and effects as those of the case shown in FIG. 1A, and in addition, when there are variations between performances of PMOS and NMOS transistors, it has an effect to correct the variations from each other.

For example, as shown in FIG. 16, when characteristics of NMOS transistor, such as the driving power and the gain, are lower than characteristics of PMOS transistor, an amplifier output waveform 1501 is deformed at a pull-down transistor side, compared to an ideal sinusoidal waveform 902. Therefore, by controlling the switching of the digital control signals SEL151N, SEL152N, SEL153N, SEL154N, SEL1555N, and SEL156N so as to strength the characteristic such as the driving power and the gain at NMOS transistor side only, the waveform of the amplifier output 1601 can be closer to the ideal sinusoidal waveform 902 from which the harmonic component is reduced, as shown in FIG. 17.

As described above, in the fourth and the fifth exemplary embodiments, since the waveform of the output can be made to be further closer to the sinusoidal waveform, compared to a case in which inputs to all of the amplification circuits are equal, by connecting a plurality of amplification circuits (digital control amplifiers) in parallel and setting and controlling each of the duty ratio and the phase of the input pulse wave of each amplification circuit independently, the odd harmonic component of the output signal can be suppressed effectively.

Also, since the amplifier is a pulse input type inverter, on/off operation can be controlled for each amplifier using digital signal. Therefore, it becomes possible to adjust the level of PMOS and NMOS transistors to be combined in such a manner that the harmonics are minimized. Further, there is an effect that it becomes possible to change the level according to the required value for the amplifier output.

EXAMPLE

In order to show the effects of the exemplary embodiments according to the invention, results of amplifying processes of a dual parallel power amplifier according to the first exemplary embodiment shown in FIG. 1A and a (non parallel) power amplifier shown in FIG. 37 are compared as a specific example.

First, with the dual parallel power amplifier, the size ratio between the NMOS transistor and the PMOS transistor was set to be 1:2, with which ON-resistances of the transistors became equal. And the size (transistor width) ratio between the NMOS transistors M12 and M14 was set to be 2:1, the frequency of the input signal (i.e., carrier frequency of the signal) was set to be 2.4 [GHz], and further, with respect to pulse waves 22 and 23 as the input signals having duty ratio of 50% or less, the pulse widths of M11 and M12 were set to be 1/6 of the pulse wave cycle 1/f0 as shown in FIG. 2.

Then, the amplifier output waveforms in a case of using a configuration shown in FIG. 37 with which the pulse wave is inputted and in a case of the first exemplary embodiment which uses the configuration shown in FIG. 1 were compared by a circuit simulation. It is shown in FIG. 18.

As is clear from the FIG. 18, the amplifier output waveform 1801 at a time of using the power amplifier shown in FIG. 37 is largely different from the sinusoidal waveform and is closer to the pulse waveform.

On the other hand, it is found that the amplifier output waveform 1802 at a time of using the parallel power amplifier of the first exemplary embodiment becomes staircase waveform which is closer to the sinusoidal waveform.

Subsequently, with respect to waveforms passed through a same band transmitting filter 13, a result of analyzing the frequency spectrums is shown in FIGS. 19 and 20.

FIG. 19 shows a frequency spectrum in a case of the first exemplary embodiment which uses the configuration shown in FIG. 1, and FIG. 20 shows a frequency spectrum in a case of using a configuration shown in FIG. 37 with which the pulse wave is inputted.

As is clear from the comparison of FIG. 19 and FIG. 20, the signal magnitude of carrier components of both frequency spectrums, i.e., components at 2.4 [GHz] are the same at 0 [dBm], but harmonic components (at 4.8 [GHz], 7.2 [GHz] . . . ) are reduced by about 15 [dBm] by using the configuration of the first exemplary embodiment shown in FIG. 1, and both of the odd harmonics and even harmonics are lowered.

Here, in each exemplary embodiment described above, an integrated circuit formed by integrating each element or at least an amplification circuit portion on a single substrate may be used.

With this, further miniaturization can be achieved, and the amplifying apparatus and amplification system having broad utility can be obtained.

As described above, with respect to the pulse input type power amplifying apparatus, the power amplifying system, the output control method, and the control program according to the invention, the specific examples are explained, and also the processing steps in the amplification circuit are disclosed including the signal waveform synthesizing method. Further, in the power amplifying system and the output control method described above, the signal processing step and the like executed by each element may be programmed to be executed by a computer.

With this, the control program which functions the same as each exemplary embodiment, and capable of attaining the above described object can be obtained.

So far, the present invention has been described by referring to the exemplary embodiments (and the examples), but the present invention is not limited to the above-described exemplary embodiments (and the examples). The configuration and the details of the present invention can be modified within the scope of the present invention in various ways which can be understood by those skilled in the art.

INDUSTRIAL APPLICABILITY

As described above, according to the invention, it is possible to realize an integral circuit of a power amplification circuit having a small area, at a low cost, which can satisfy the radio standard without using a band transmitting filter having an excellent harmonic band transmitting characteristic, by using a pulse input type amplifier operable at low-voltage and low-power, and, it is possible to provide a signal waveform synthesizing method and a signal waveform synthesizing program used therein. Therefore, this invention is possible to be used in broad industrial fields where a small sized radio oscillation device such as a mobile telephone is required.

BRIEF DESCRIPTION OF THE DRAWINGS

FIG. 1B is a block diagram showing an example of a pulse waveform generating device disclosed in FIG. 1A;

FIG. 2 is a waveform chart showing a waveform and an operation timing of each part of the first exemplary embodiment disclosed in FIGS. 1A and 1B;

FIG. 25 is an explanatory diagram showing an operation and the like of the phase interpolator disclosed in FIG. 24;

FIG. 29A is an illustration showing an example of combination of the phase modulation signals, and FIG. 29B is an illustration showing another example of combination of the phase modulation signals;

FIG. 39 is a block diagram showing a configuration example of a constant amplitude wave synthesizing type amplifier of a related art.

REFERENCE NUMERALS

Figure 1A:
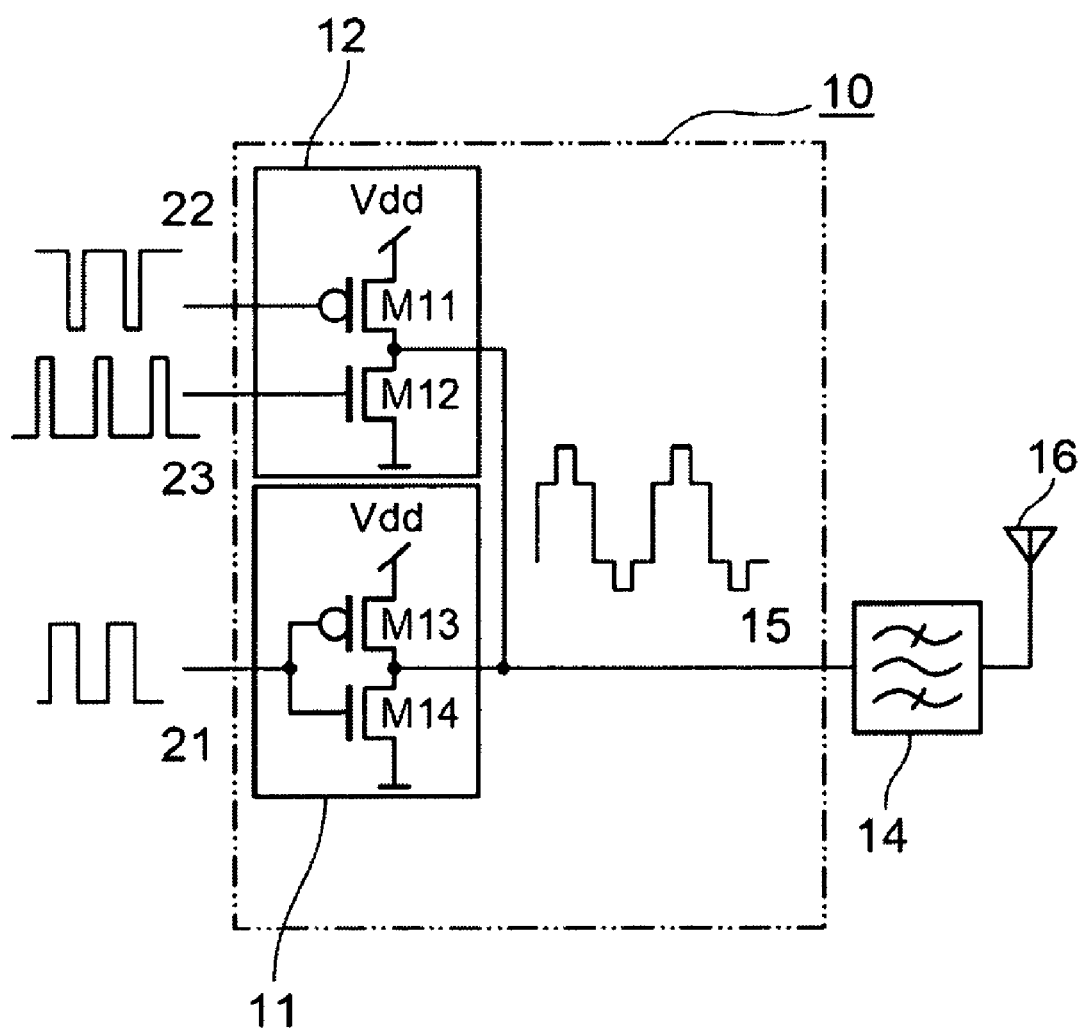
FIG. 1A is a block diagram showing a first exemplary embodiment of the invention.
Figure 3:
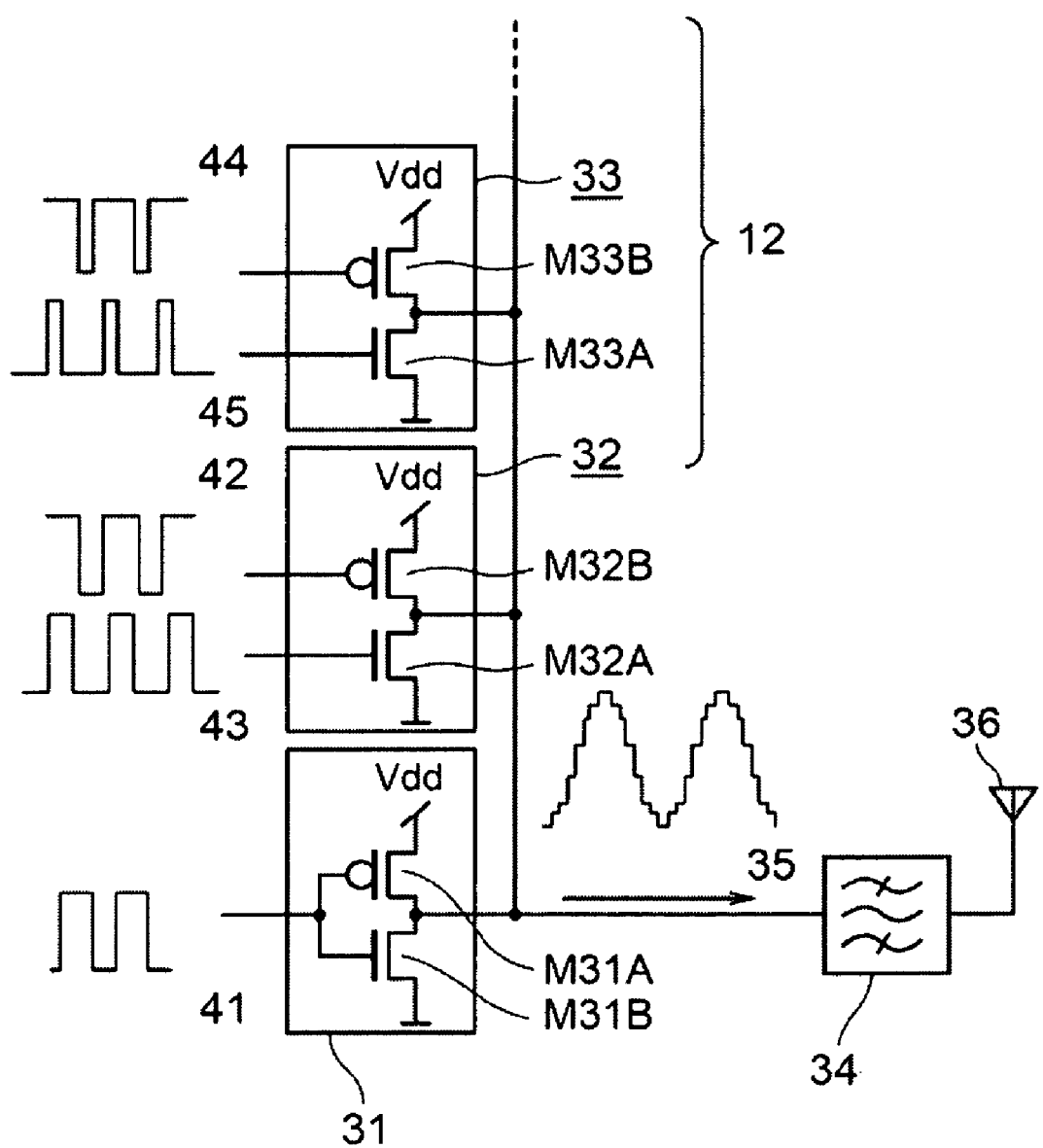
FIG. 3 is a block diagram showing a configuration of a second exemplary embodiment of the invention.
Figure 4:
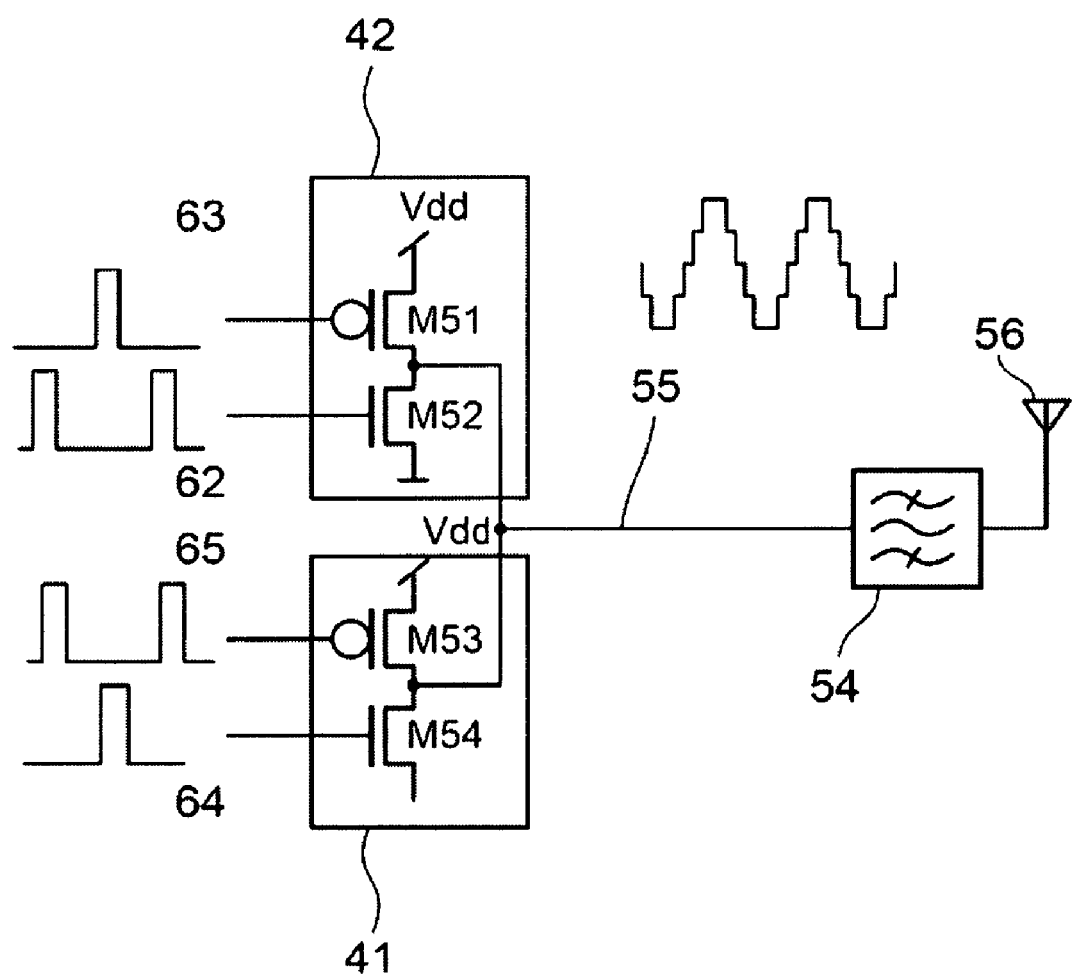
FIG. 4 is a block diagram showing a configuration of a third exemplary embodiment of the invention.
Figure 5:
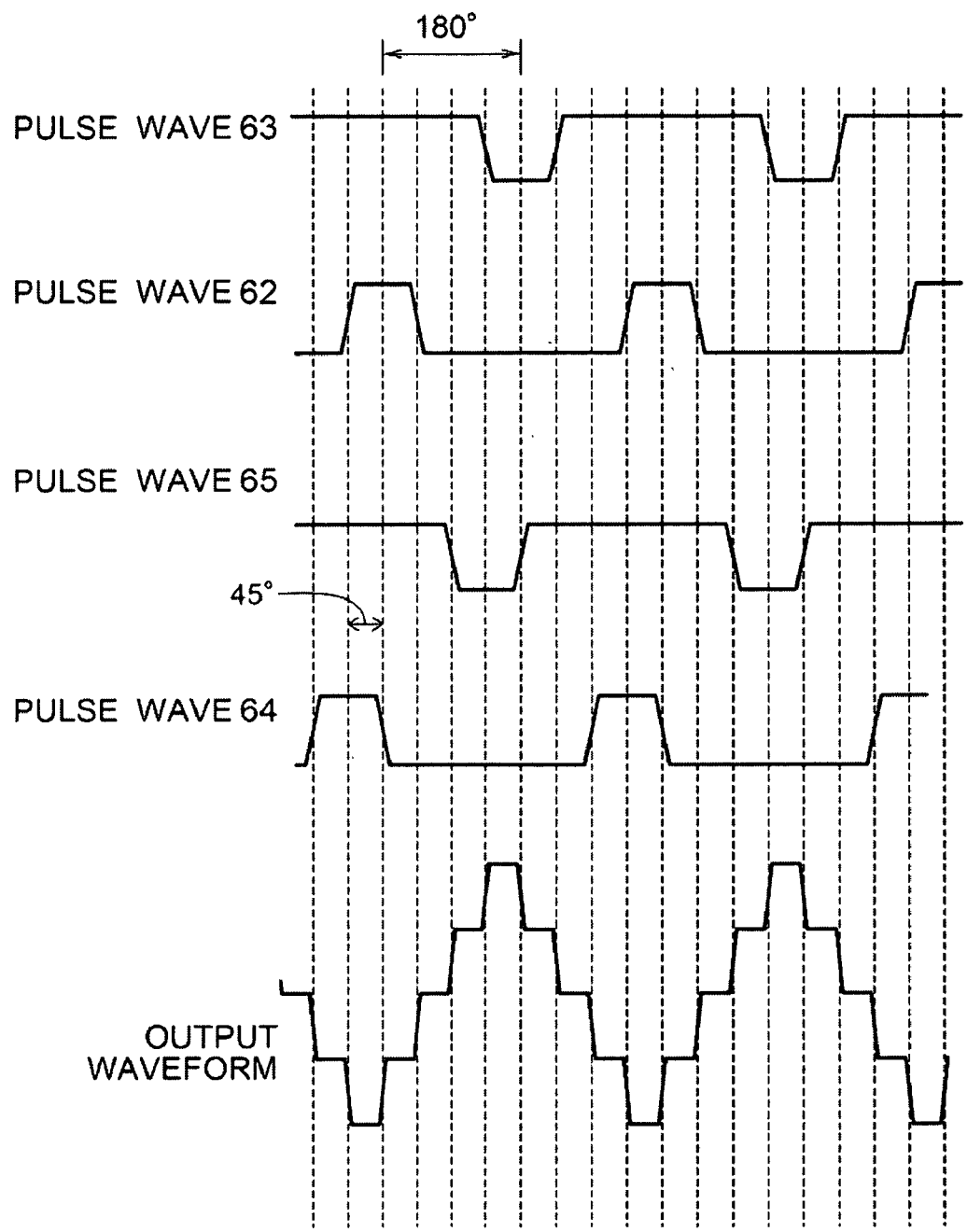
FIG. 5 is a waveform chart showing a waveform and an operation timing of each part of the third exemplary embodiment disclosed in FIG. 4.
Figure 6:
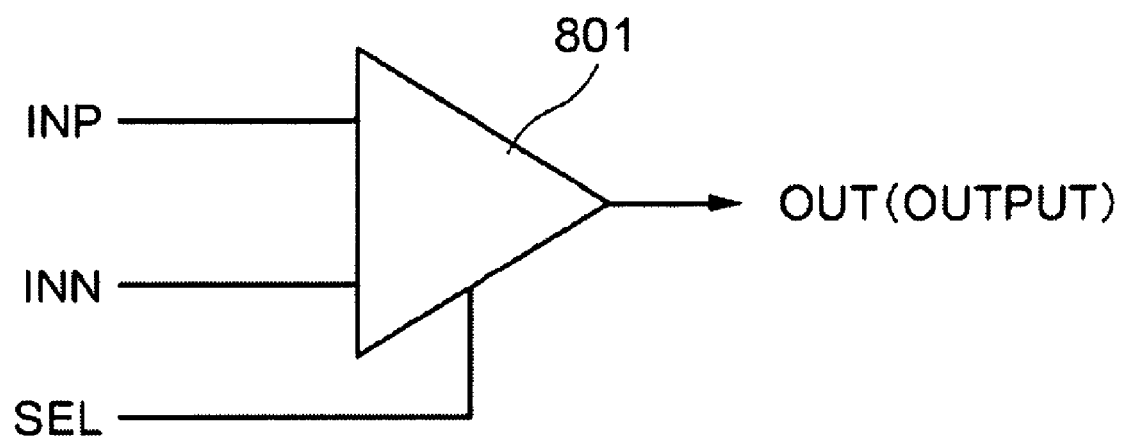
FIG. 6 is an explanatory diagram showing an amplification circuit provided in a fourth exemplary embodiment of the invention.
Figure 7:
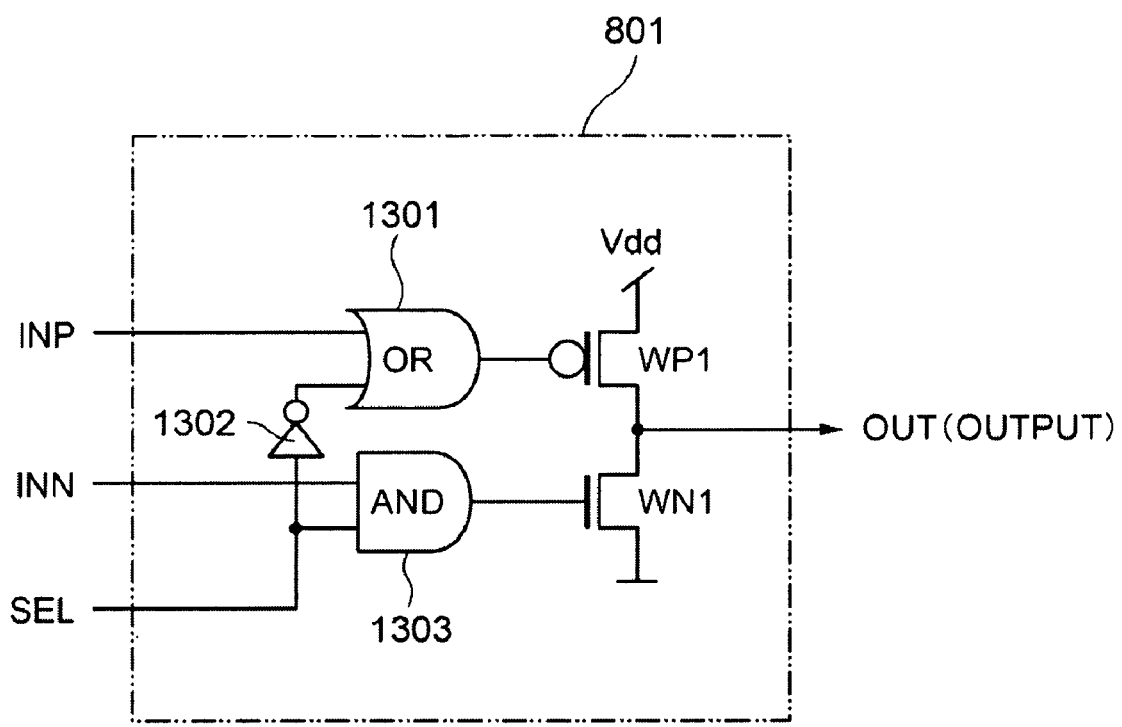
FIG. 7 is a circuit diagram showing a content of the amplification circuit shown in FIG. 6.
Figure 8:
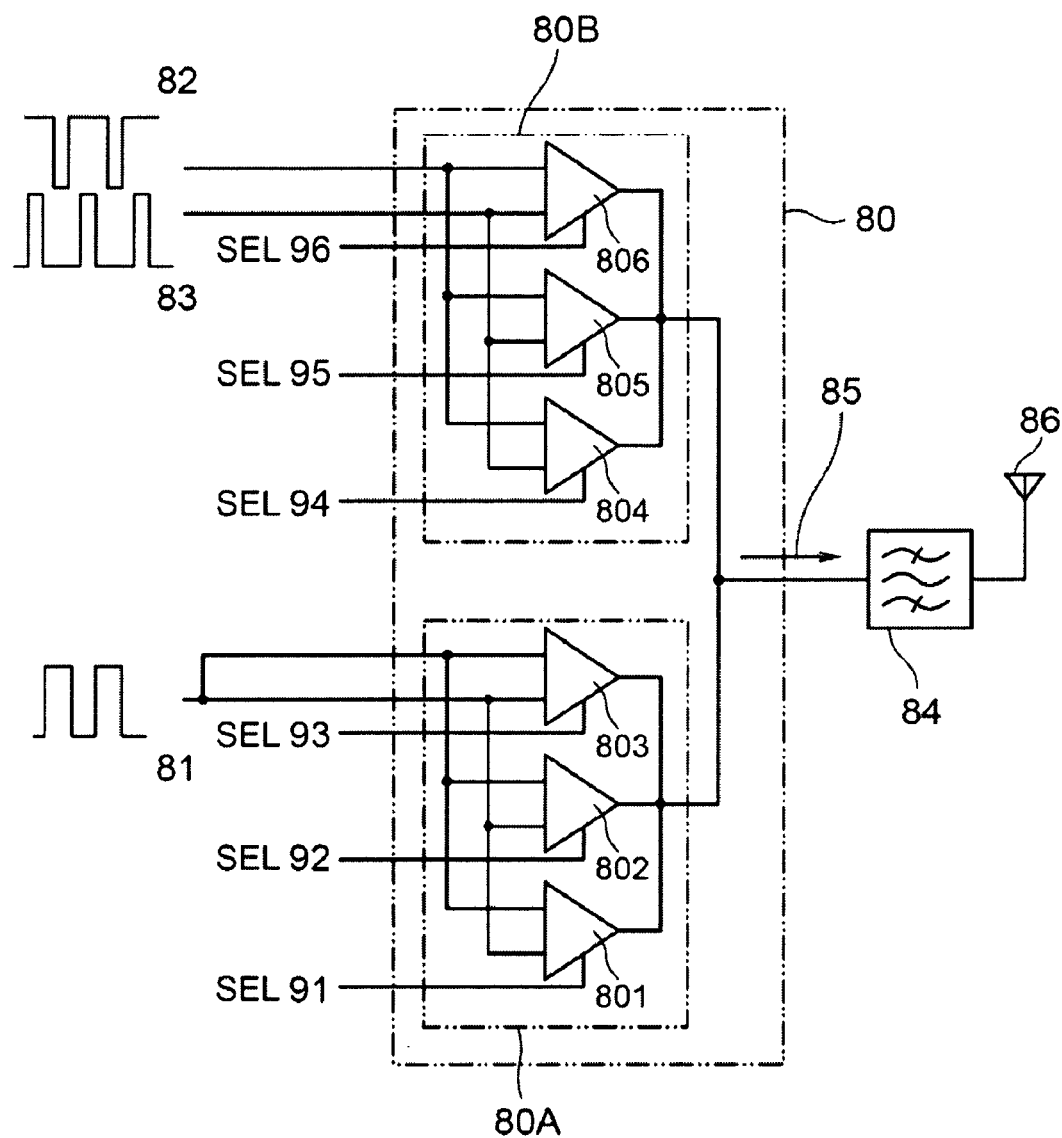
FIG. 8 is a block diagram showing an entire configuration of the fourth exemplary embodiment of the invention.
Figure 9A:
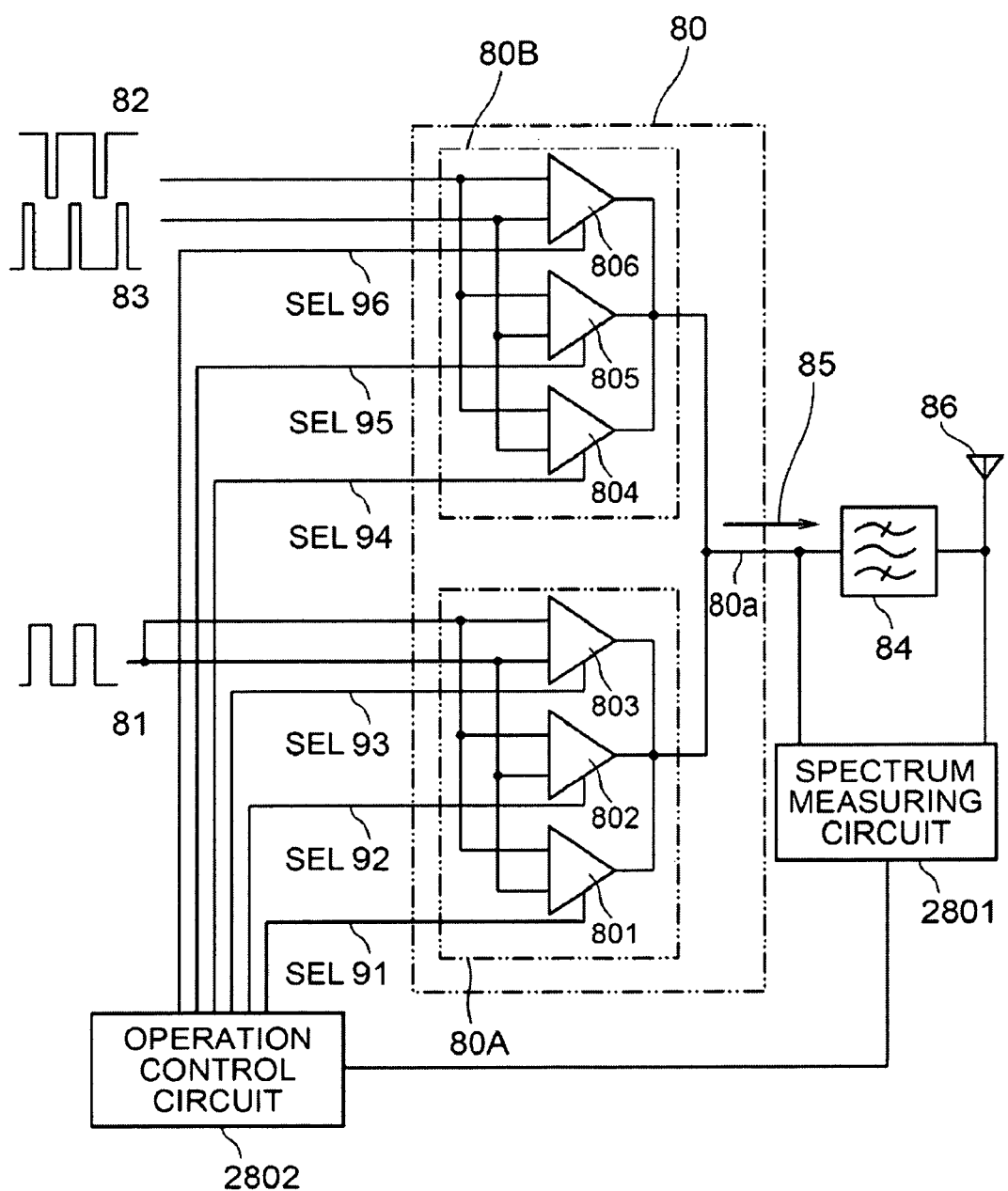
FIG. 9A is a block diagram showing a configuration example of a case when an operation control circuit and a spectrum detection circuit are added to the configuration disclosed in FIG. 8.
Figure 9B:
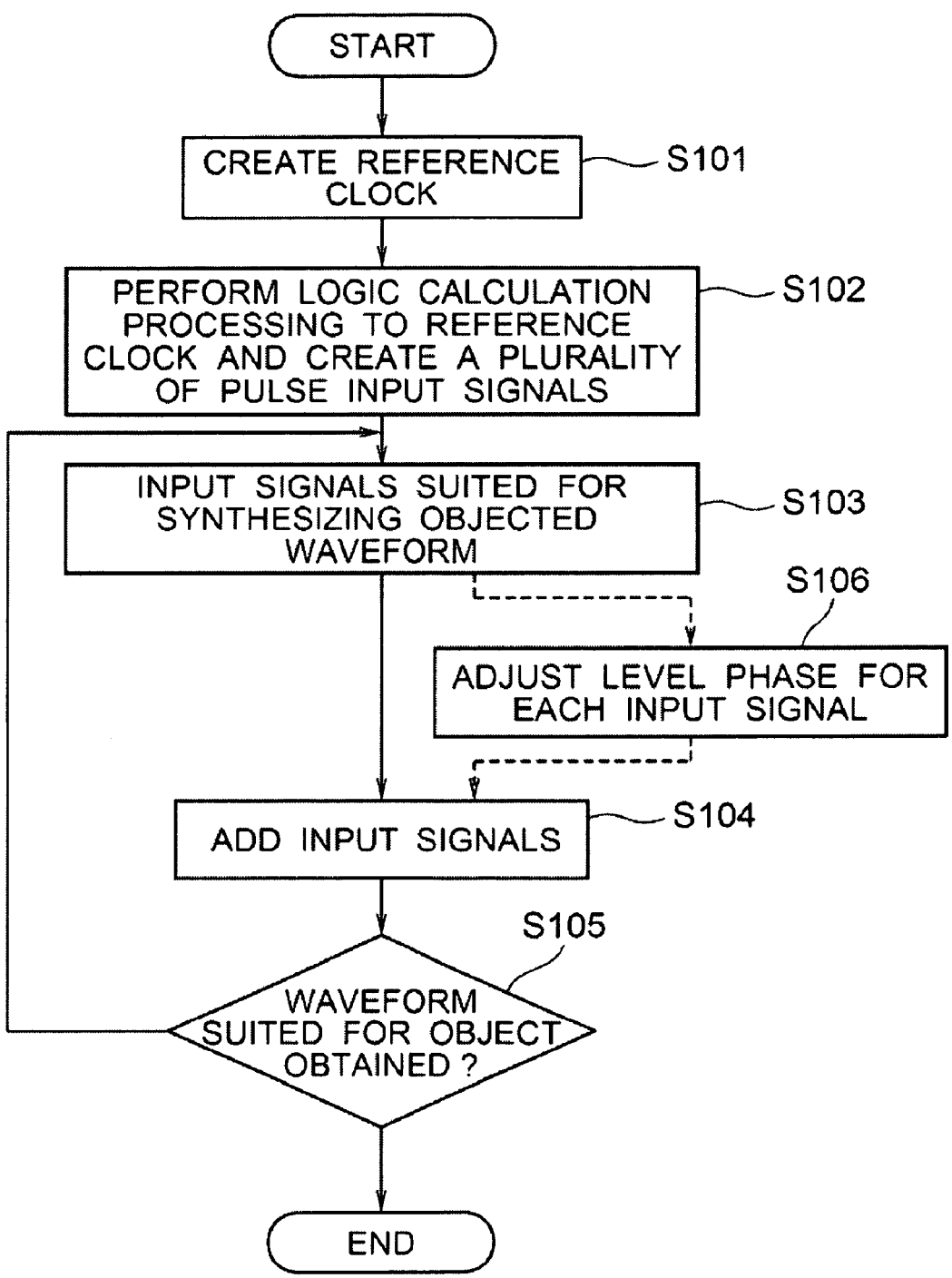
FIG. 9B is a flow chart showing an operation of the configuration disclosed in FIG. 9A.
Figure 9C:
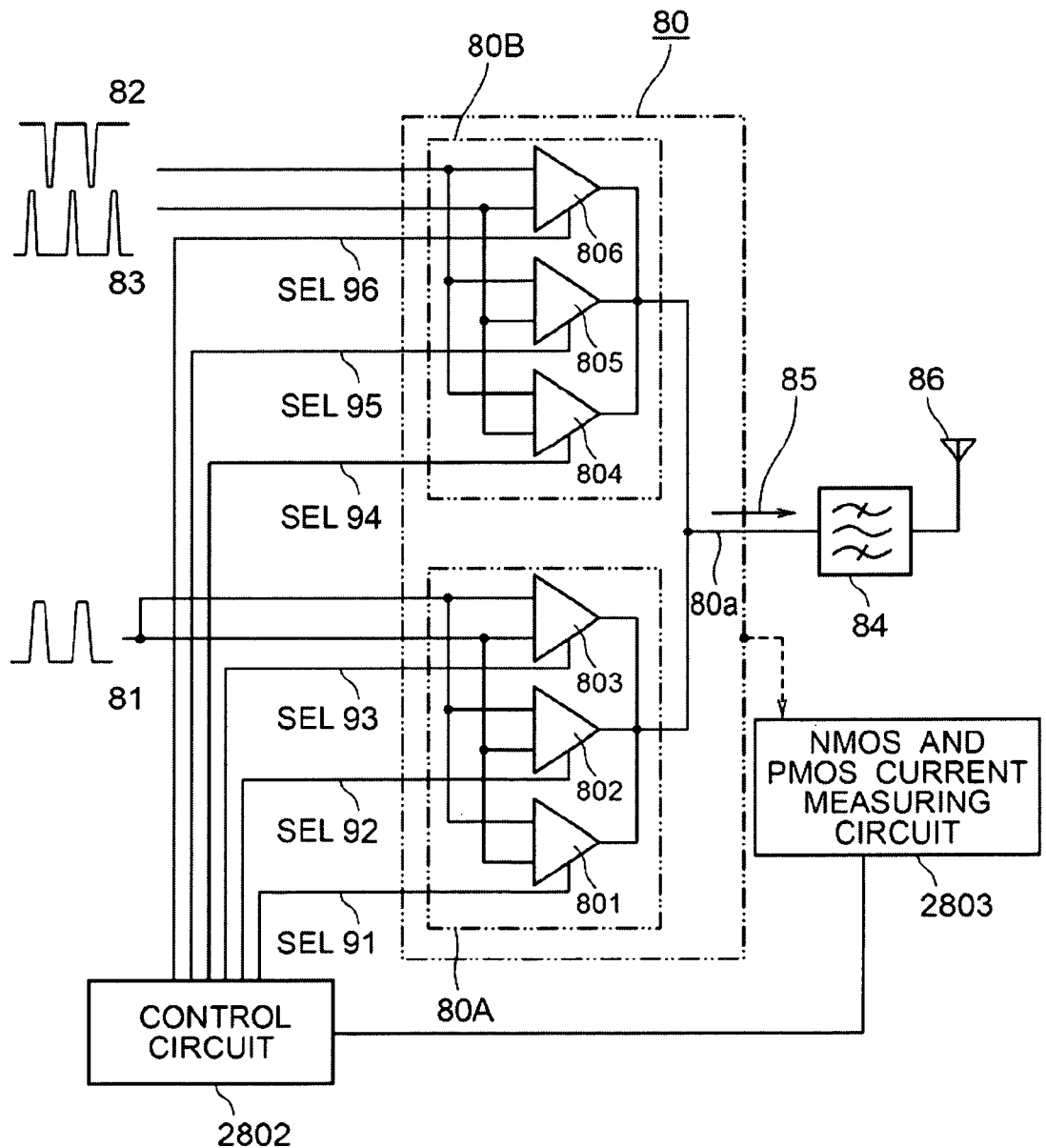
FIG. 9C is a block diagram showing an example of a case in which a current measuring circuit is added instead of the spectrum detection circuit disclosed in FIG. 9A.
Figure 10:
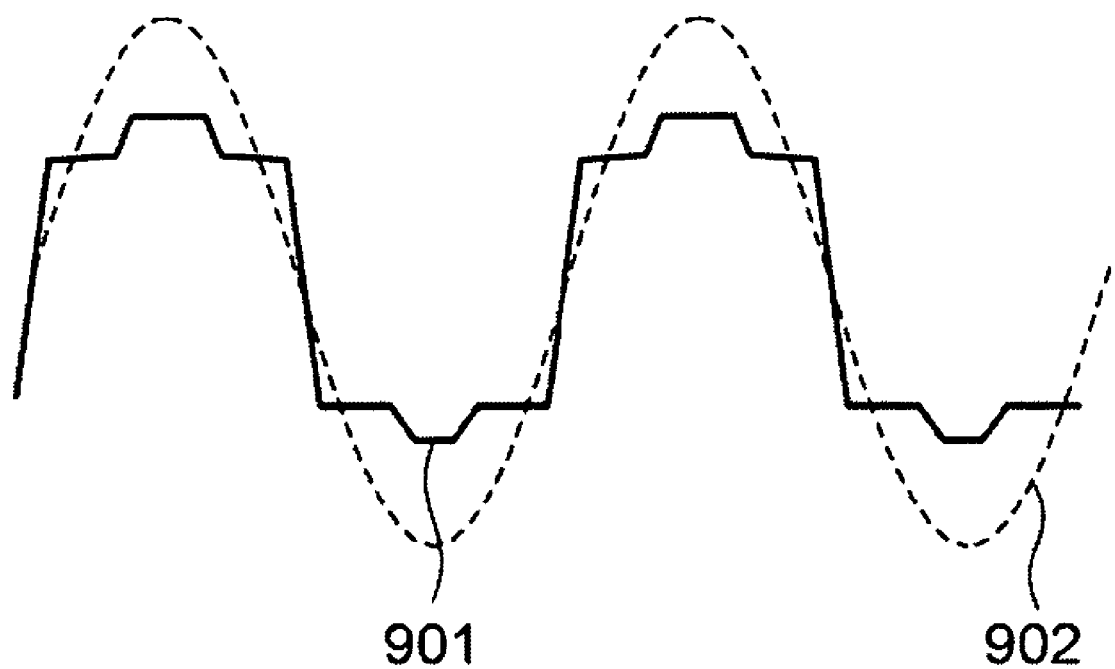
FIG. 10 is a waveform chart showing an output waveform of an amplifying unit before a control signal is made to be an optimum value in the fourth exemplary embodiment disclosed in FIG. 8.
Figure 11:
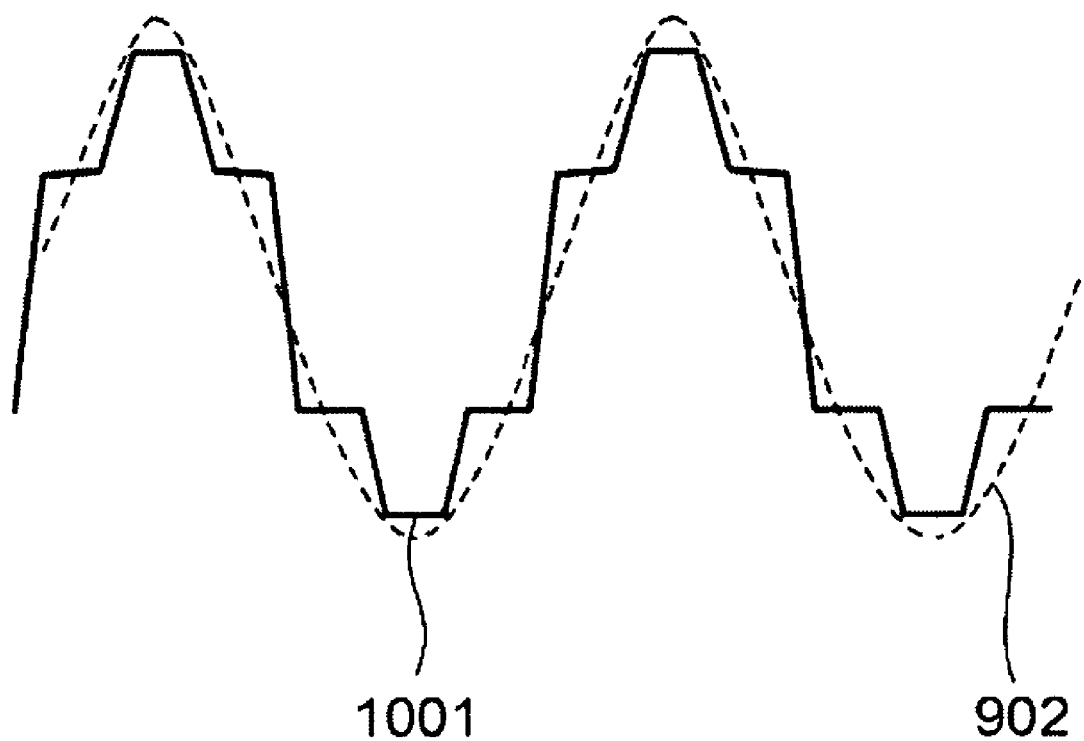
FIG. 11 is a waveform chart showing an output waveform of an amplifying unit after a control signal is made to be an optimum value in the fourth exemplary embodiment disclosed in FIG. 8.
Figure 12:
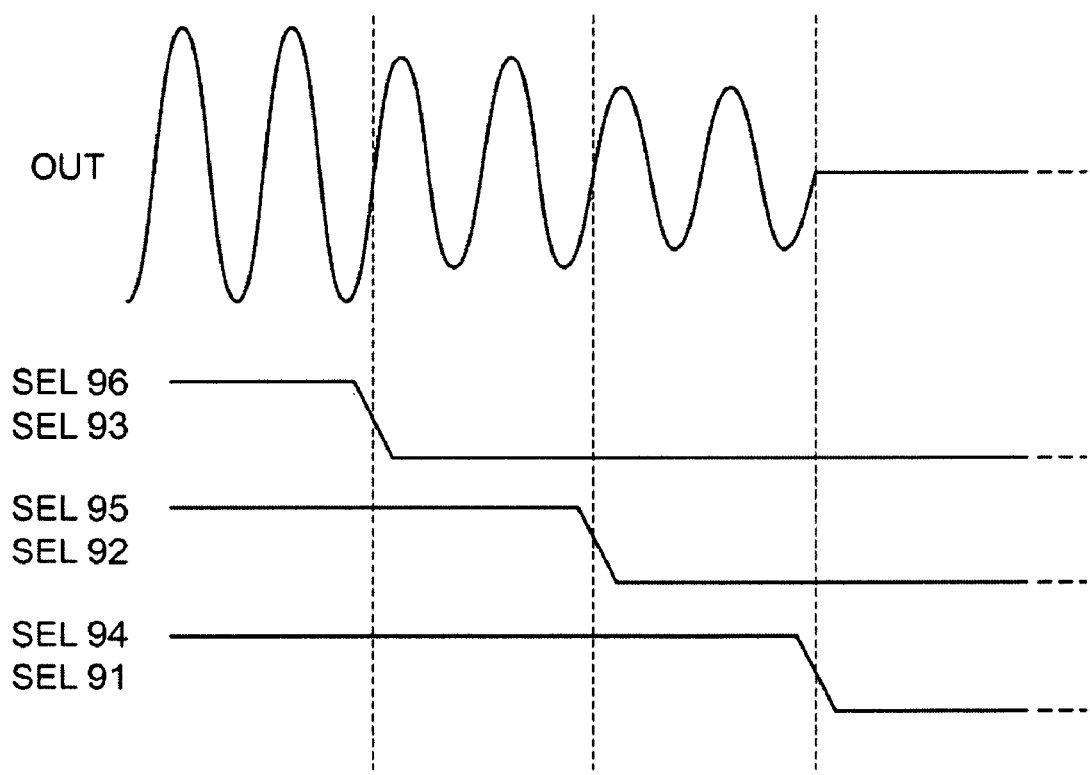
FIG. 12 is a waveform chart showing a state in which the fourth exemplary embodiment disclosed in FIG. 8 is adjusted to an amplitude modulation.
Figure 13:
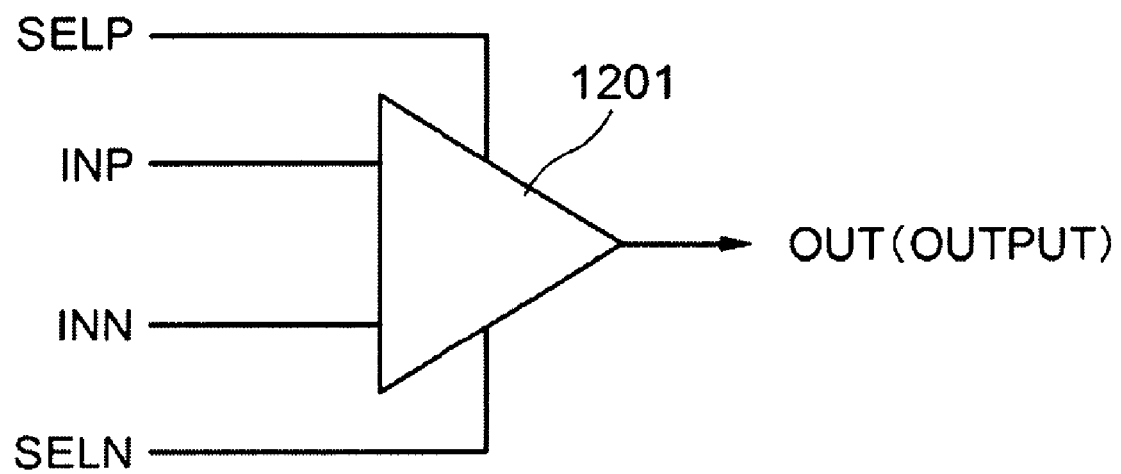
FIG. 13 is an explanatory diagram showing an example (symbol) of an amplification circuit provided in a fifth exemplary embodiment of the invention.
Figure 14:
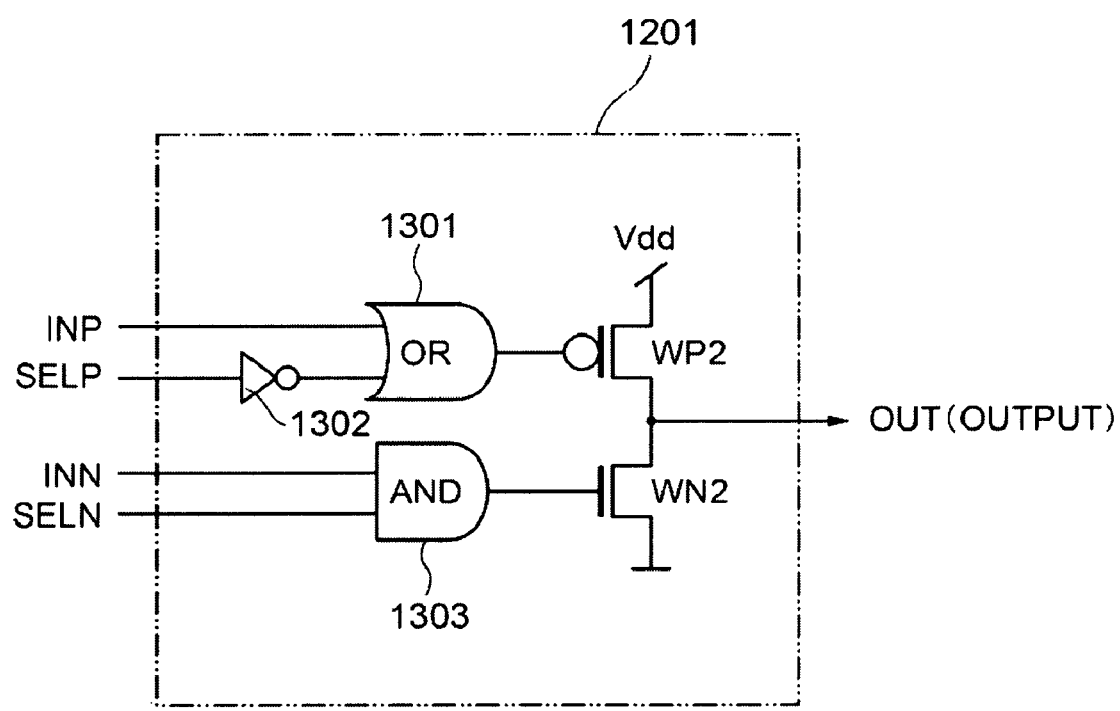
FIG. 14 is a circuit diagram showing a content of the amplification circuit shown in FIG. 13.
Figure 15:
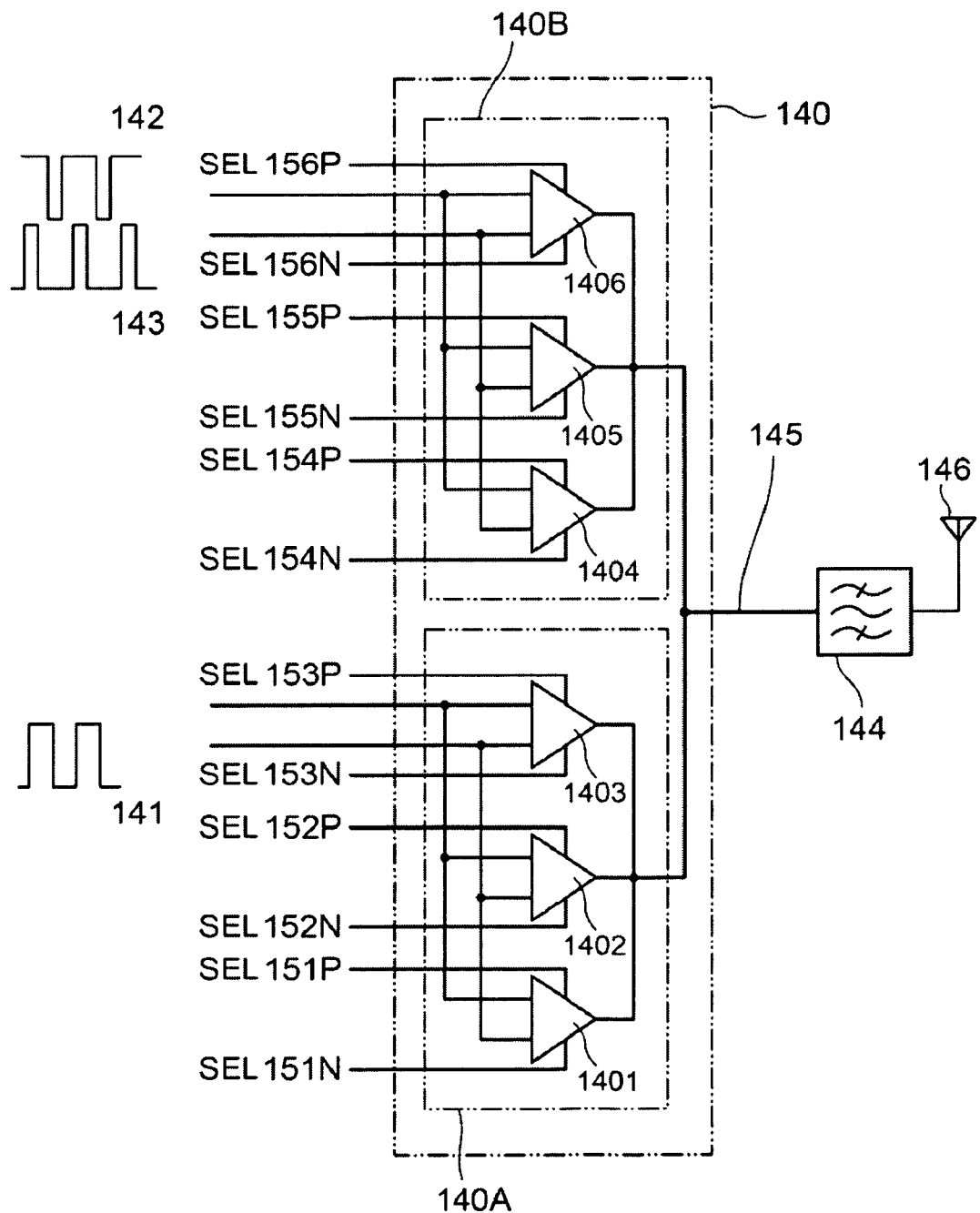
FIG. 15 is a block diagram showing an entire configuration of the fifth exemplary embodiment of the invention.
Figure 16:
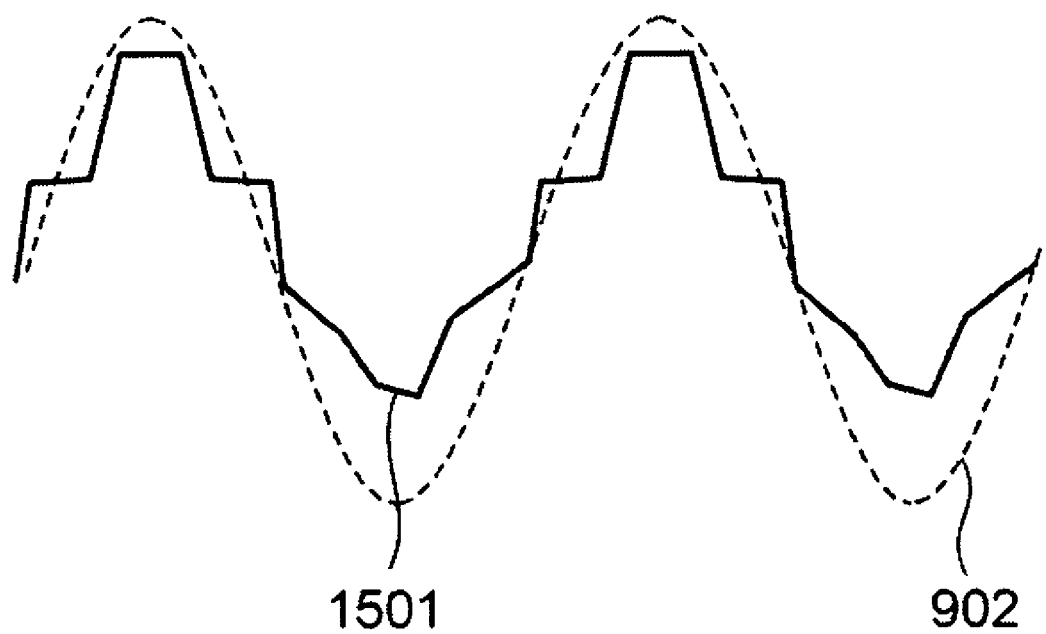
FIG. 16 is a waveform chart showing an output waveform of an amplifying unit before a control signal is made to be an optimum value in the fifth exemplary embodiment disclosed in FIG. 15.
Figure 17:
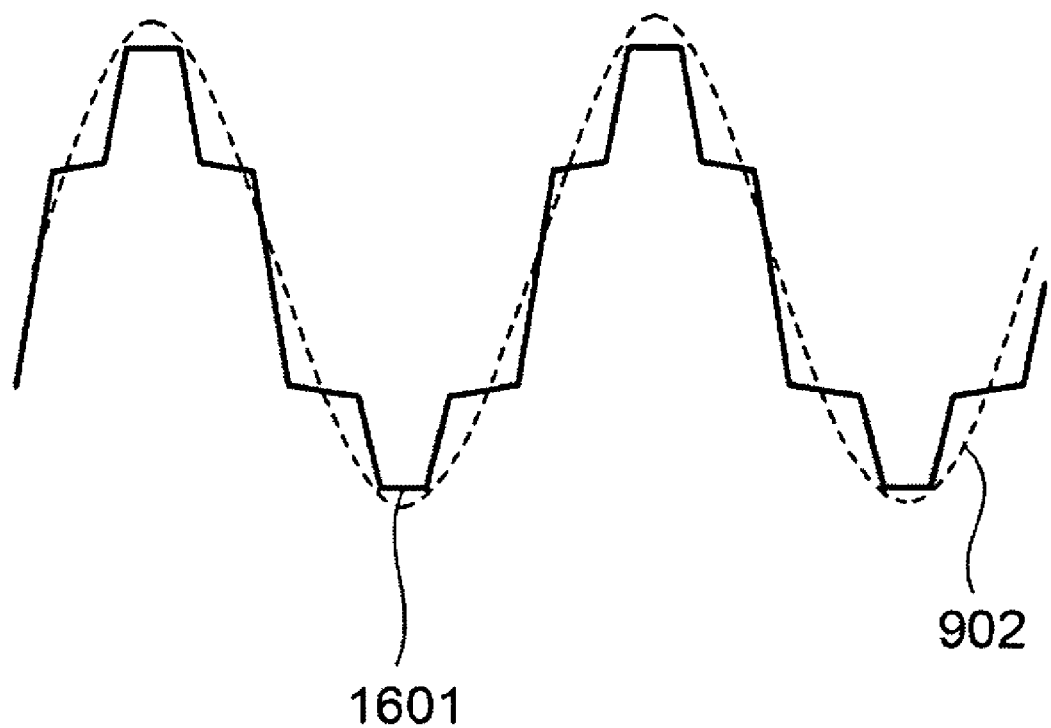
FIG. 17 is a waveform chart showing an output waveform of an amplifying unit after a control signal is made to be an optimum value in the fifth exemplary embodiment disclosed in FIG. 15.
Figure 18:
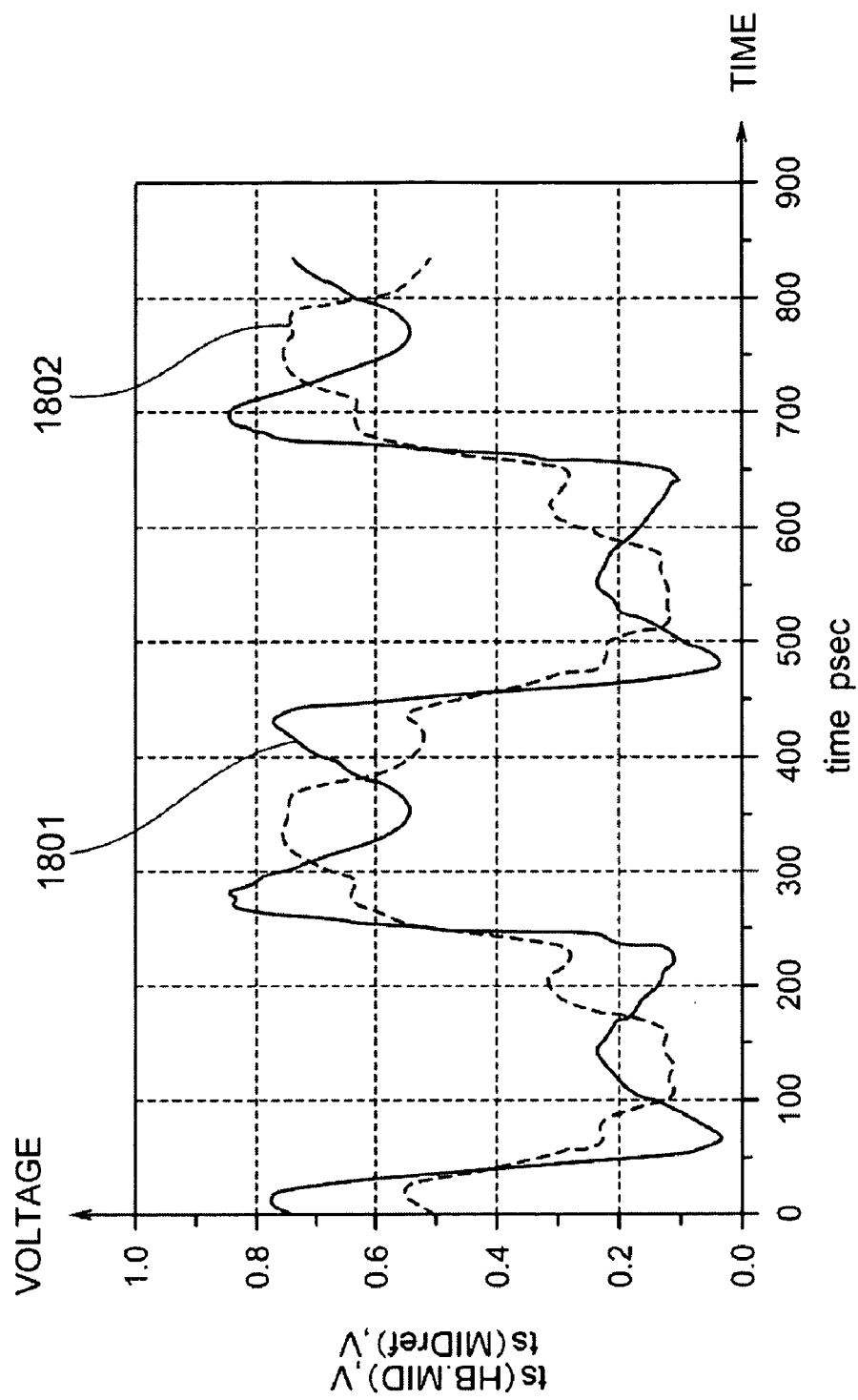
FIG. 18 is a waveform chart showing a comparison example of output waveforms of a power amplifier of this invention and that of a traditional amplifier.
Figure 19:
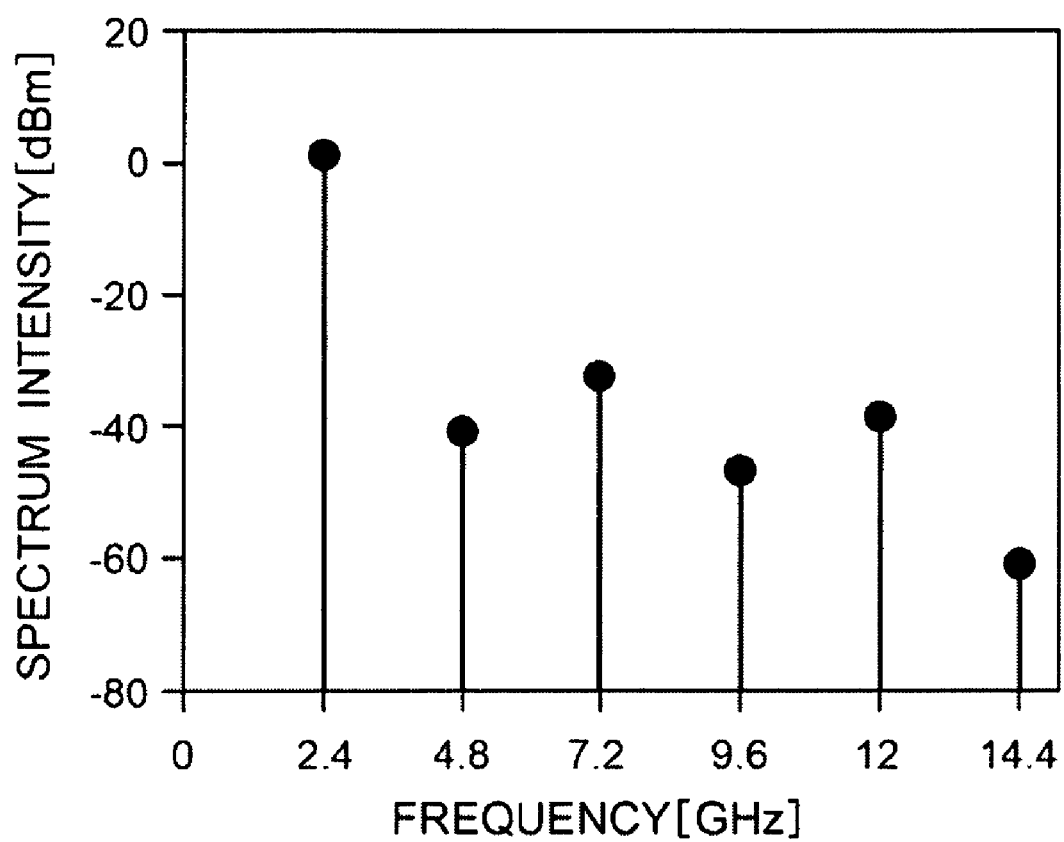
FIG. 19 is a diagram showing a spectrum distribution of the power amplifier output of the present invention.
Figure 20:
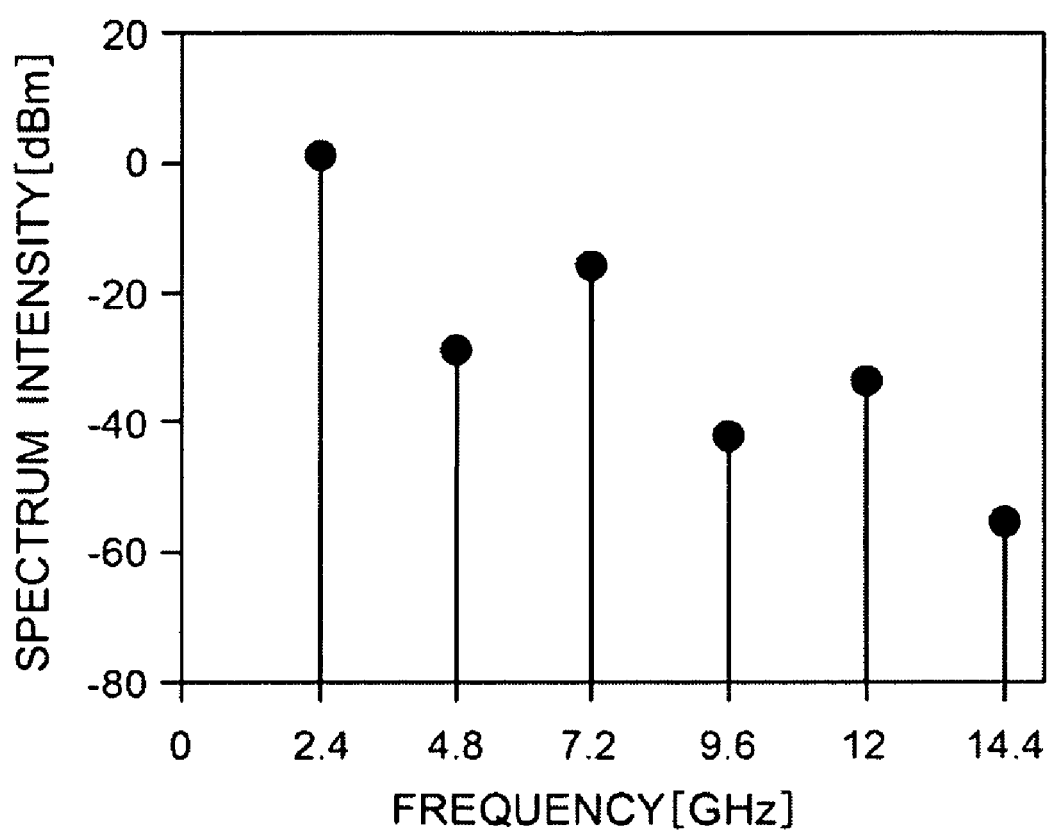
FIG. 20 is a diagram showing a spectrum distribution of a traditional power amplifier output.
Figure 21:
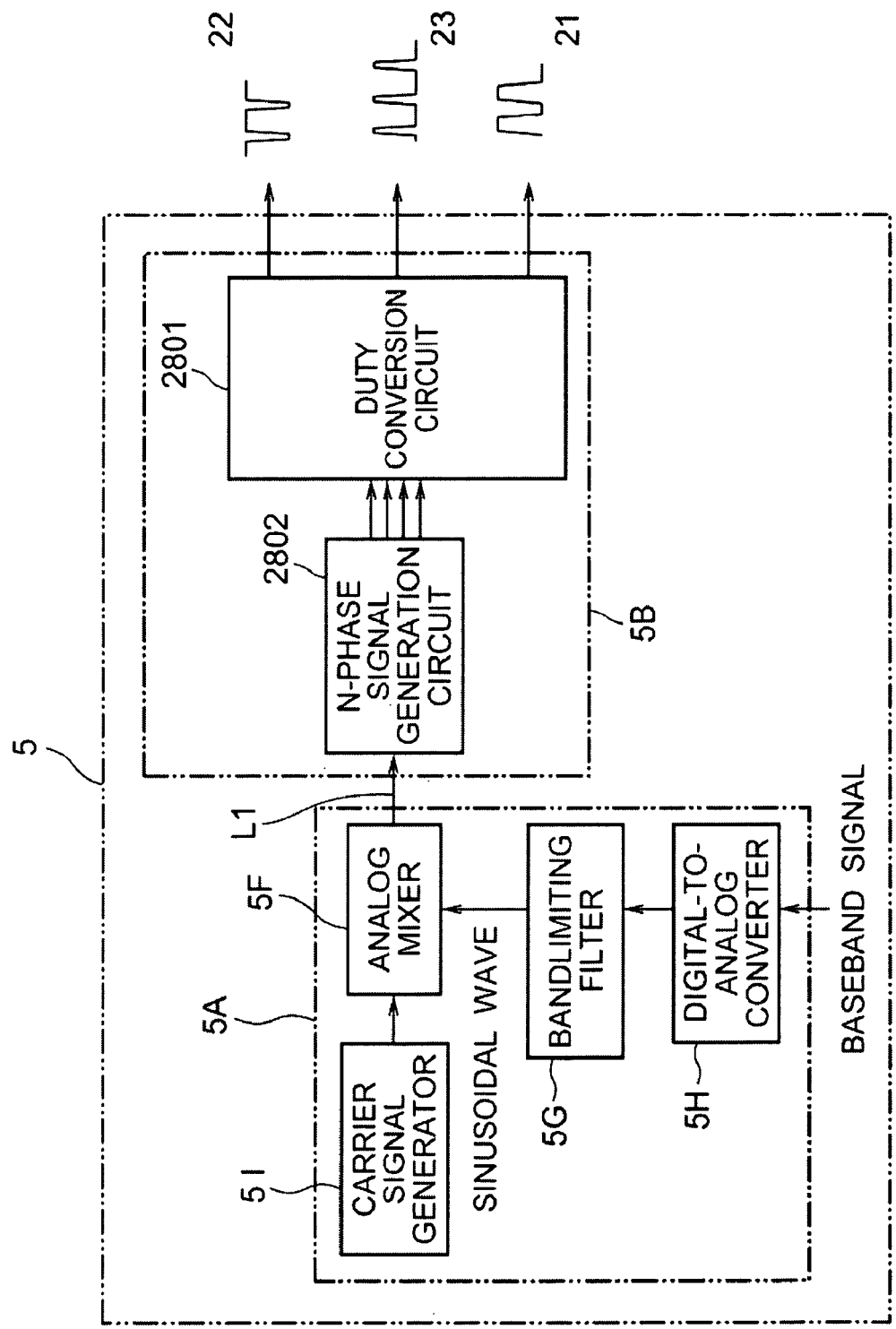
FIG. 21 is a block diagram showing another example of the pulse wave forming device disclosed in FIG. 9B.
Figure 22:
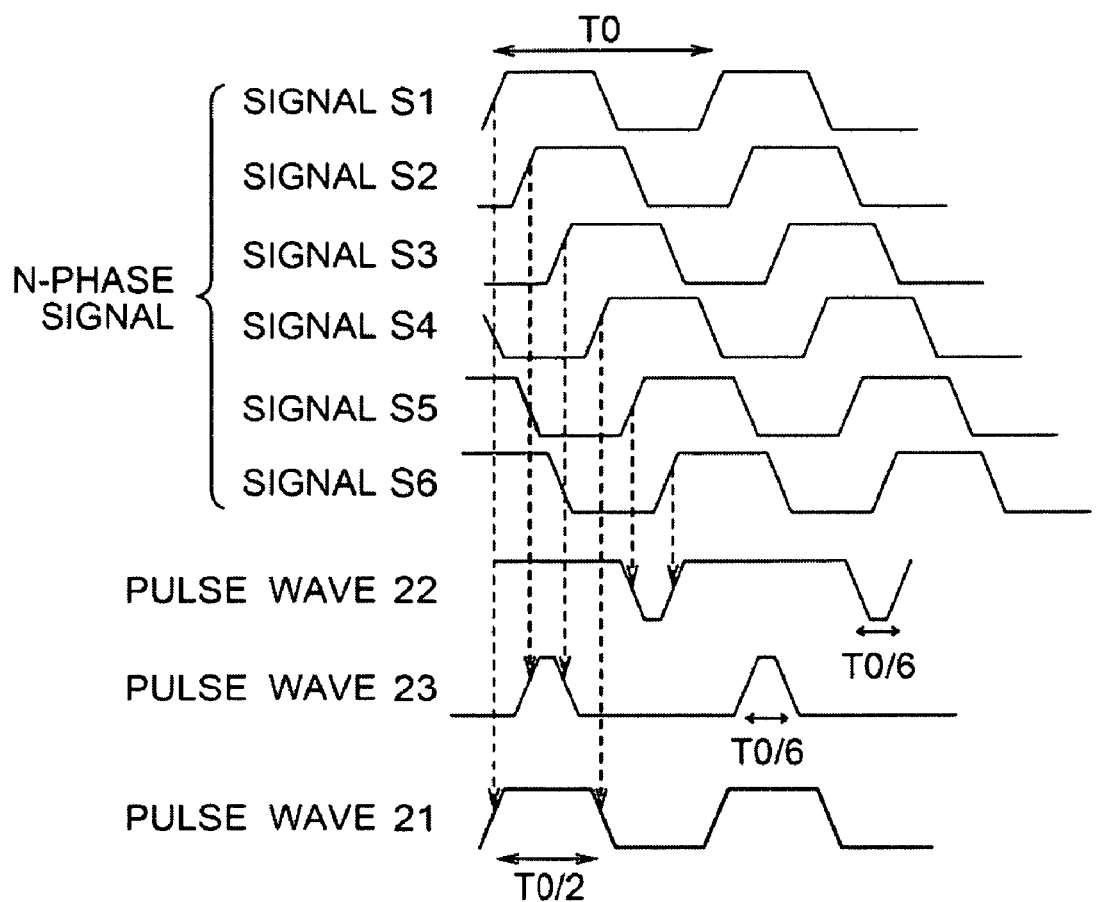
FIG. 22 is an explanatory diagram showing a generation state of an output pulse of the pulse generation circuit disclosed in FIG. 21.
Figure 23:
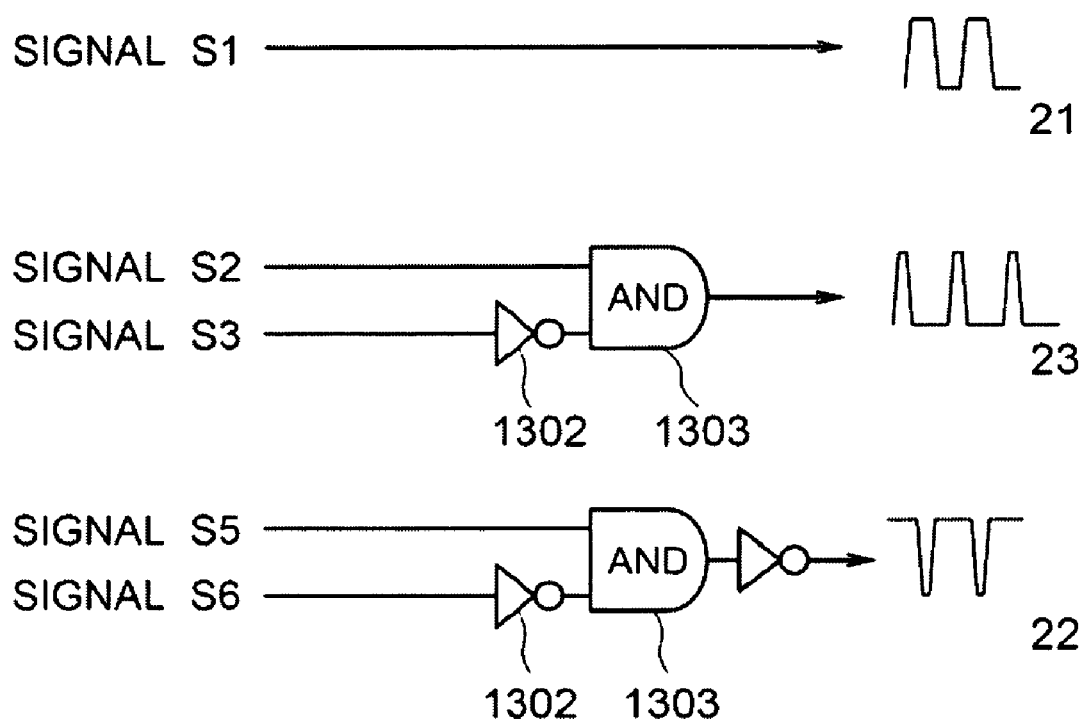
FIG. 23 is an explanatory diagram showing a logic circuit output and the like that generate various types of pulse waves disclosed in FIG. 21.
Figure 24:
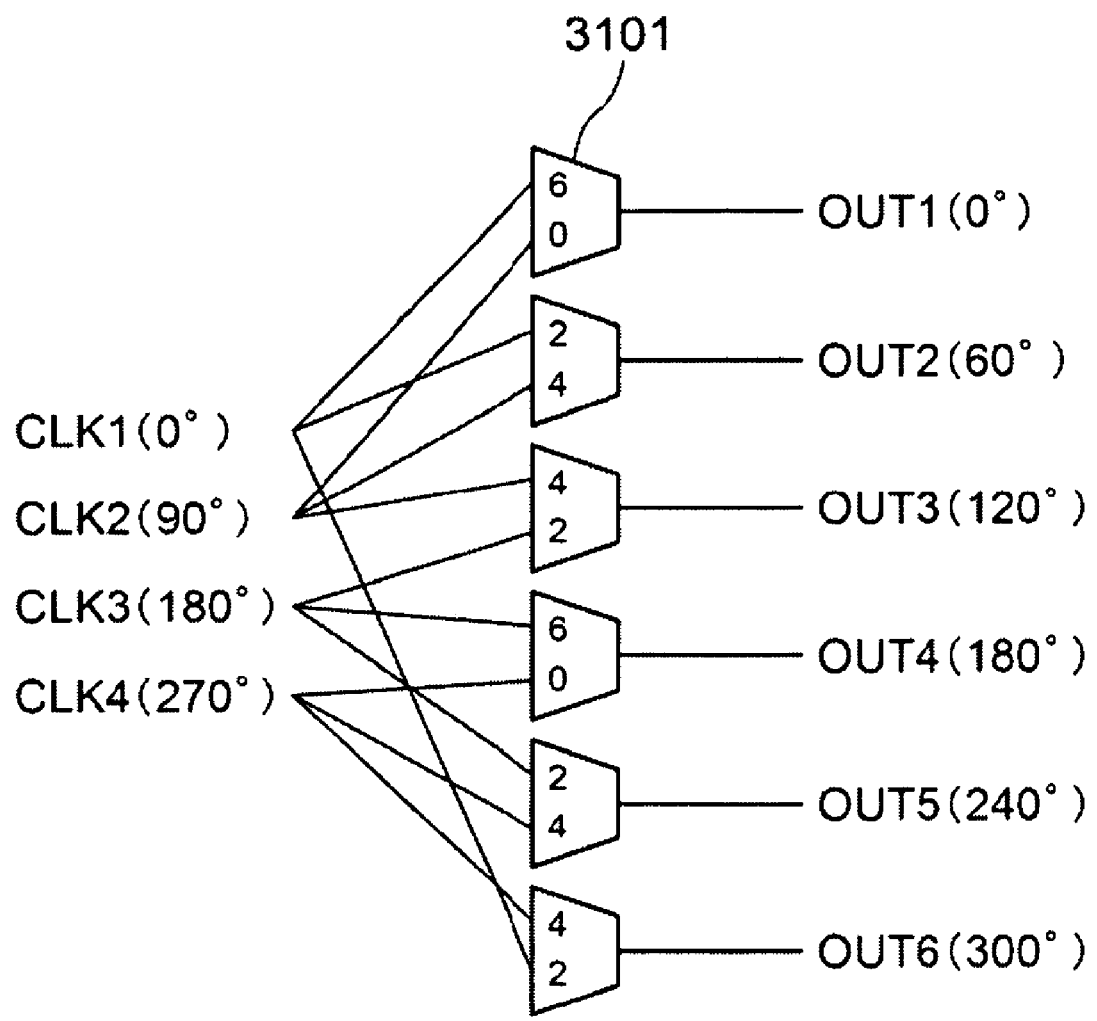
FIG. 24 is an explanatory diagram showing a specific example of an N-phase clock conversion circuit (N number of phase interpolators) disclosed in FIG. 21.
Figure 26:
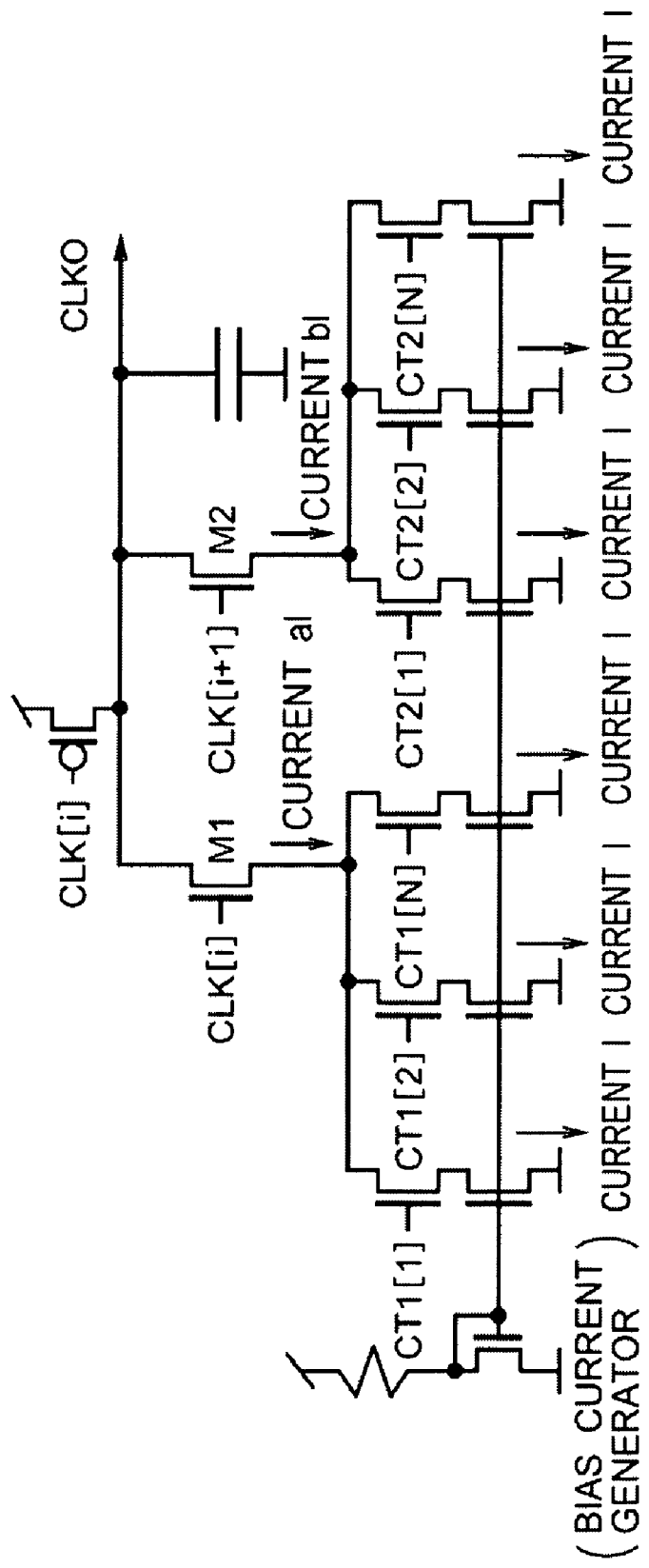
FIG. 26 is a circuit diagram showing a configuration example of the phase interpolator disclosed in FIG. 24 (combination of a dynamic circuit and a constant current source circuit)
Figure 27:
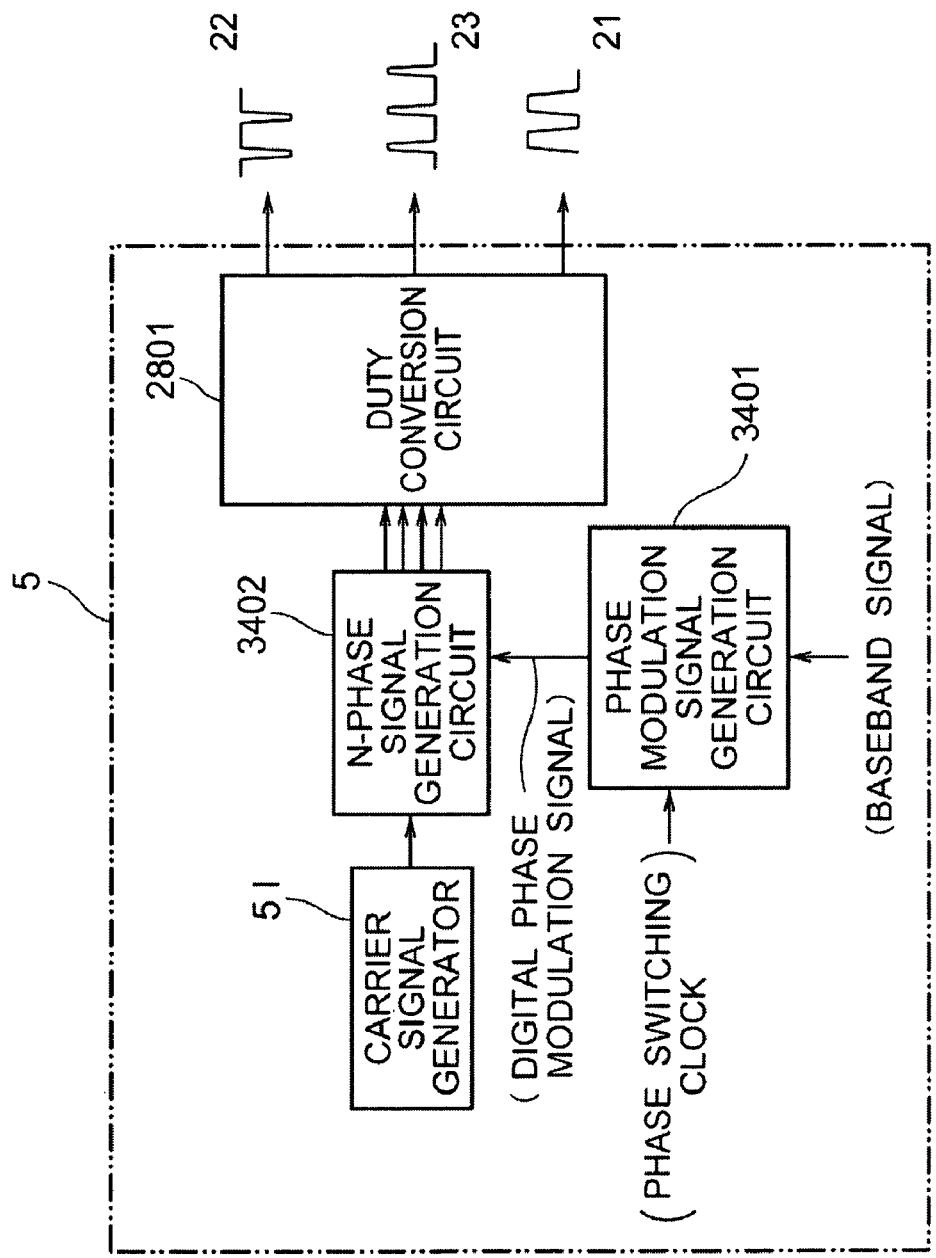
FIG. 27 is an explanatory diagram showing a practical configuration example of the pulse wave forming device disclosed in FIG. 21.
Figure 28:
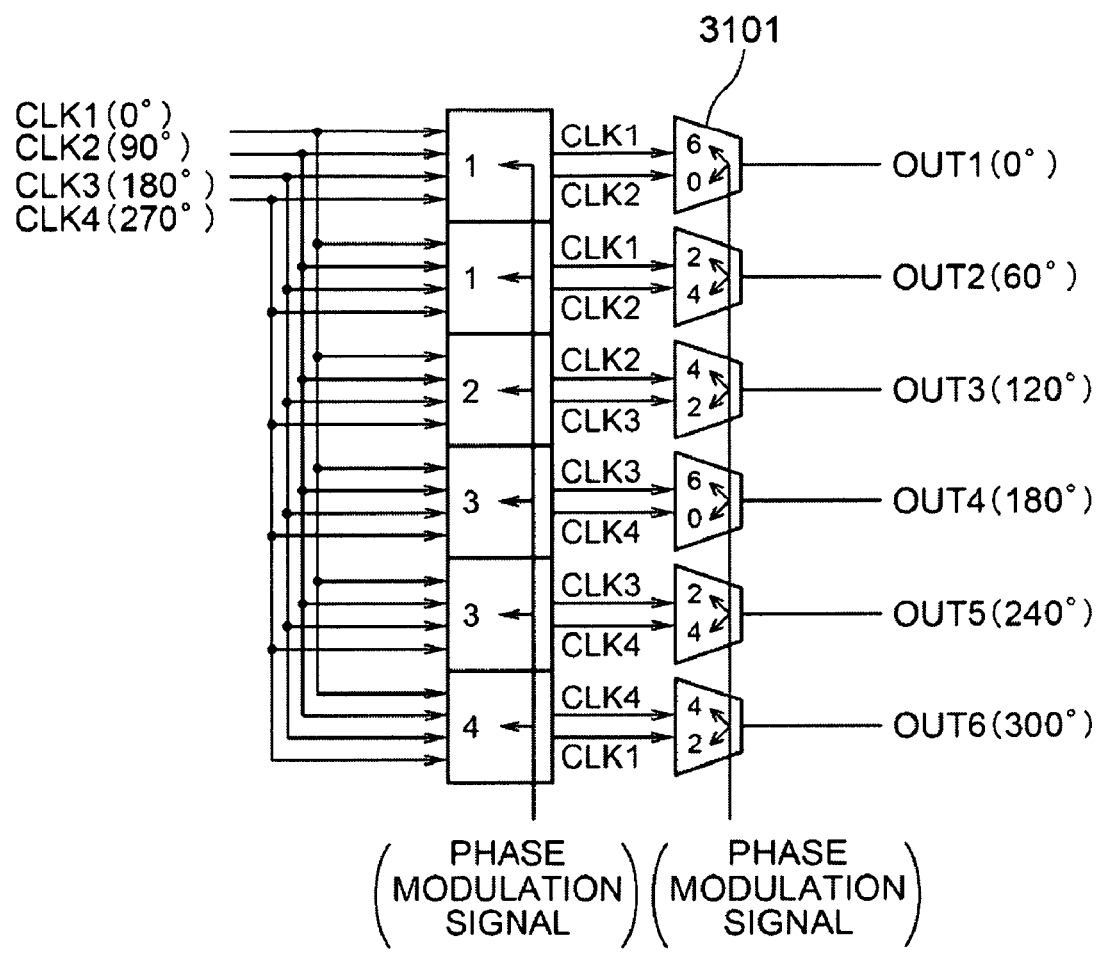
FIG. 28 is an explanatory diagram showing a specific example of an N-phase signal generation circuit disclosed in FIG. 27.
Figure 29A:
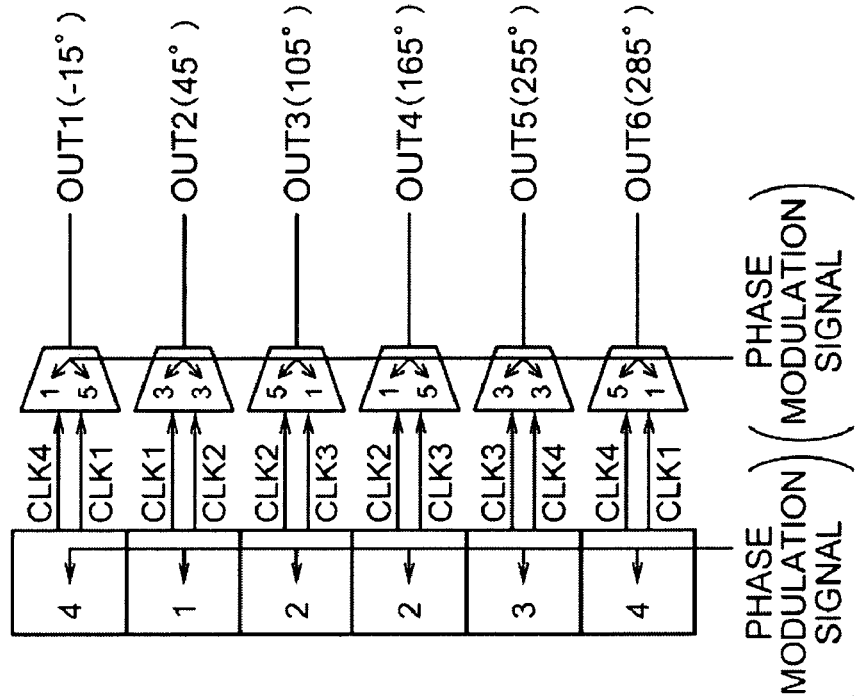
FIGS. 29A and 29B are explanatory diagrams according to a phase modulation signal disclosed in FIG. 27.
Figure 29B:
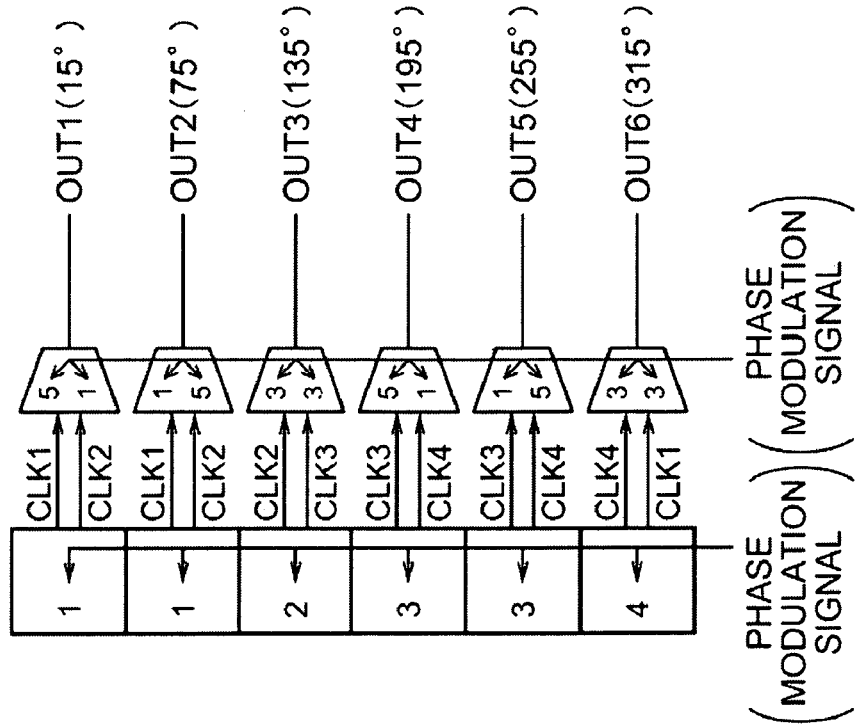
Figure 30:
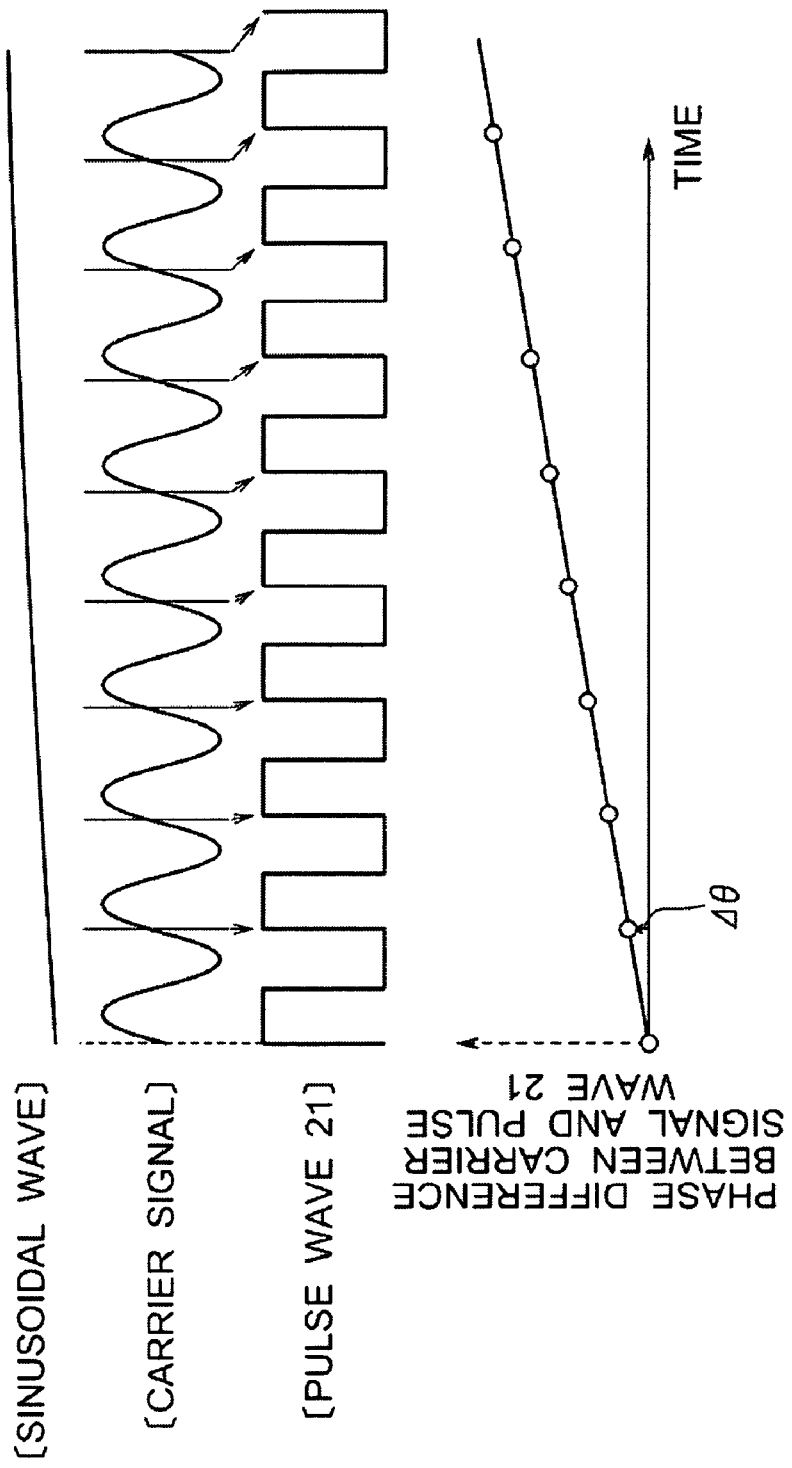
FIG. 30 is an explanatory diagram showing a time change in a phase relationship between a carrier signal and a pulse wave 21 when the phase of the carrier signal is modulated by a method shown in FIG. 21.
Figure 31:
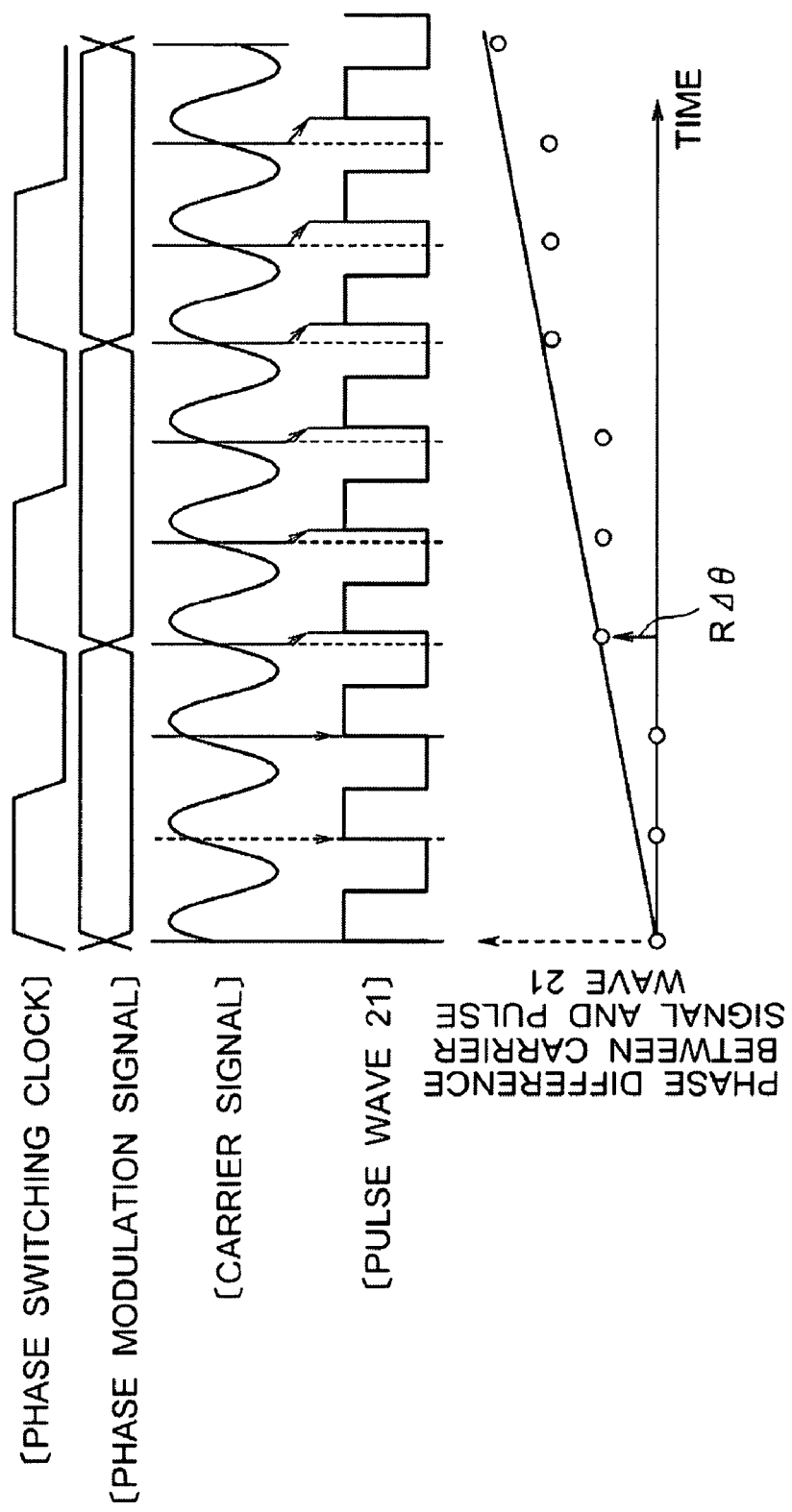
FIG. 31 is an explanatory diagram showing a time change in a phase relationship between a carrier signal and a pulse wave 21 when the phase of the carrier signal is modulated by a method shown in FIG. 27.
Figure 32:
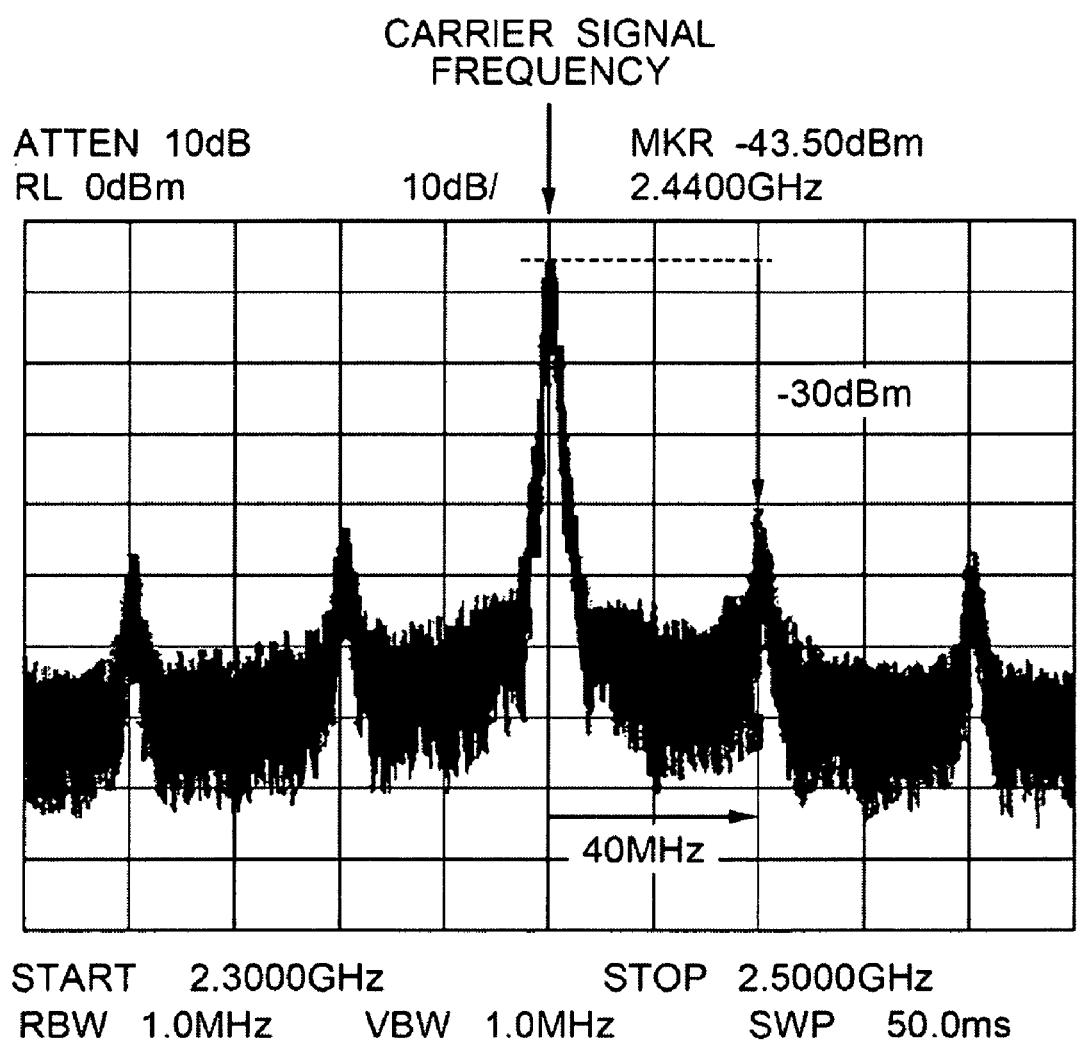
FIG. 32 shows a power spectrum of an output signal of the power amplifier when a phase switching clock is set to be 40 [MHz] by a method shown in FIG. 31.
Figure 33:
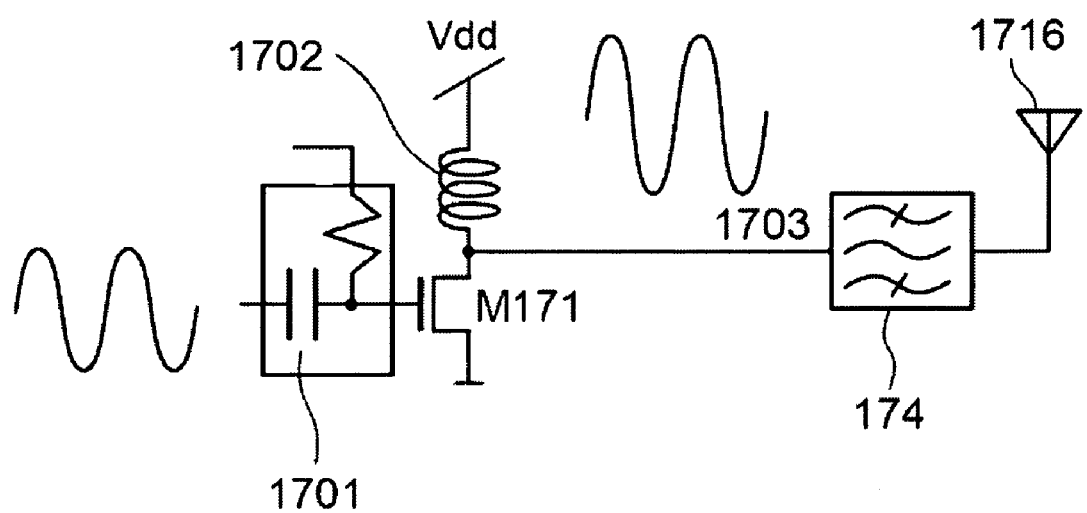
FIG. 33 is a block diagram showing a configuration example of a sinusoidal wave input power amplifier of a related art.
Figures 34A, 34B:
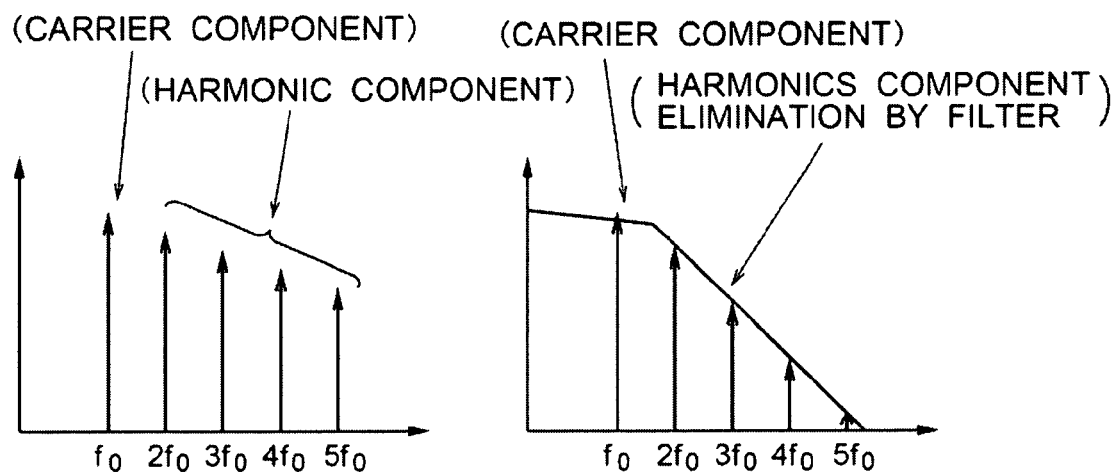
FIG. 34 is a diagram showing a spectrum distribution of the power amplifier output (a), and a spectrum distribution of the band transmission filter output (b)
Figure 35:
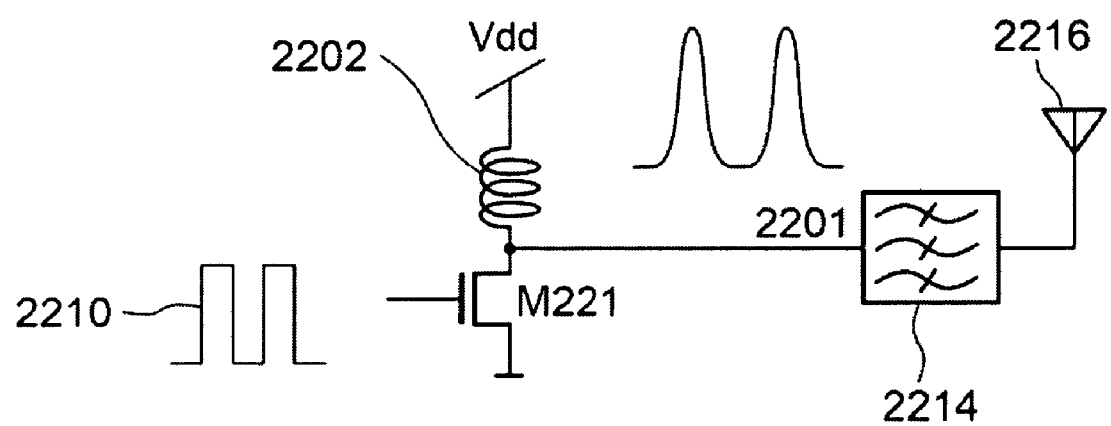
FIG. 35 is a block diagram showing a configuration example of a pulse wave input power amplifier of a related art.
Figure 36:
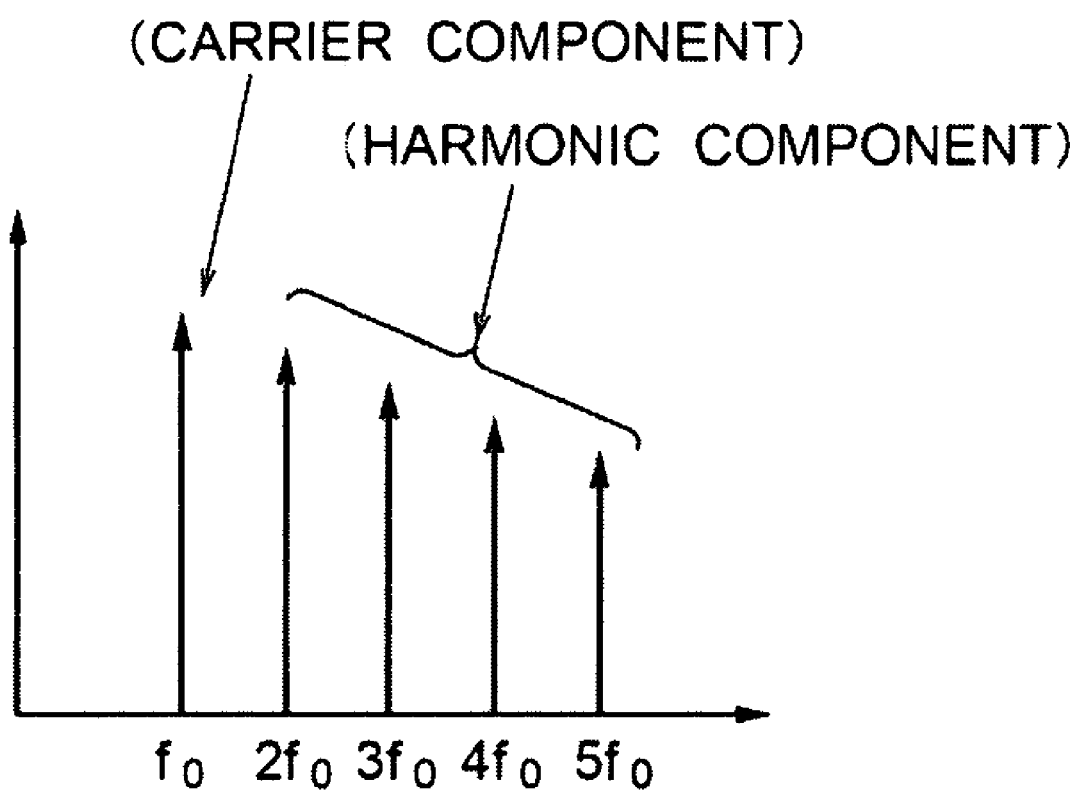
FIG. 36 is a diagram showing a spectrum distribution of the output of the power amplifier shown in FIG. 35.
Figure 37:
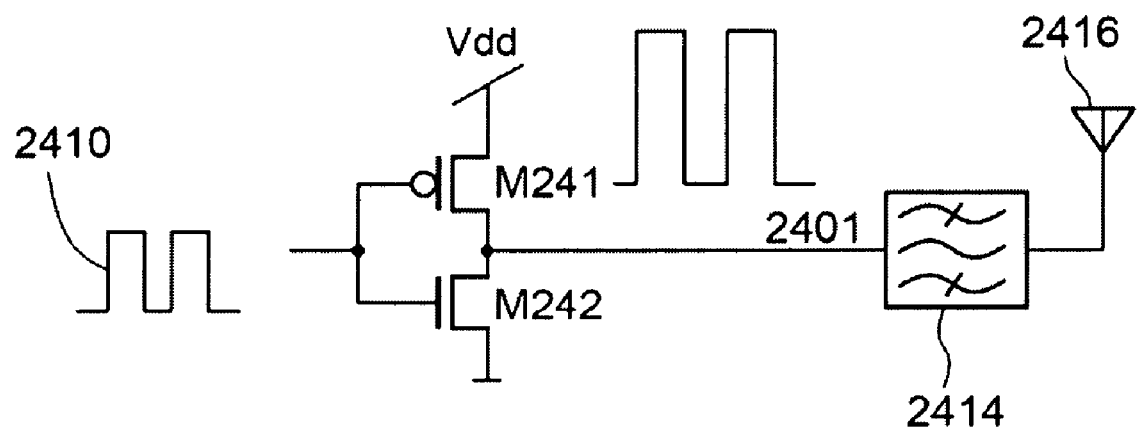
FIG. 37 is a block diagram showing a configuration example of an inverter type power amplifier of a related art.
Figure 38:
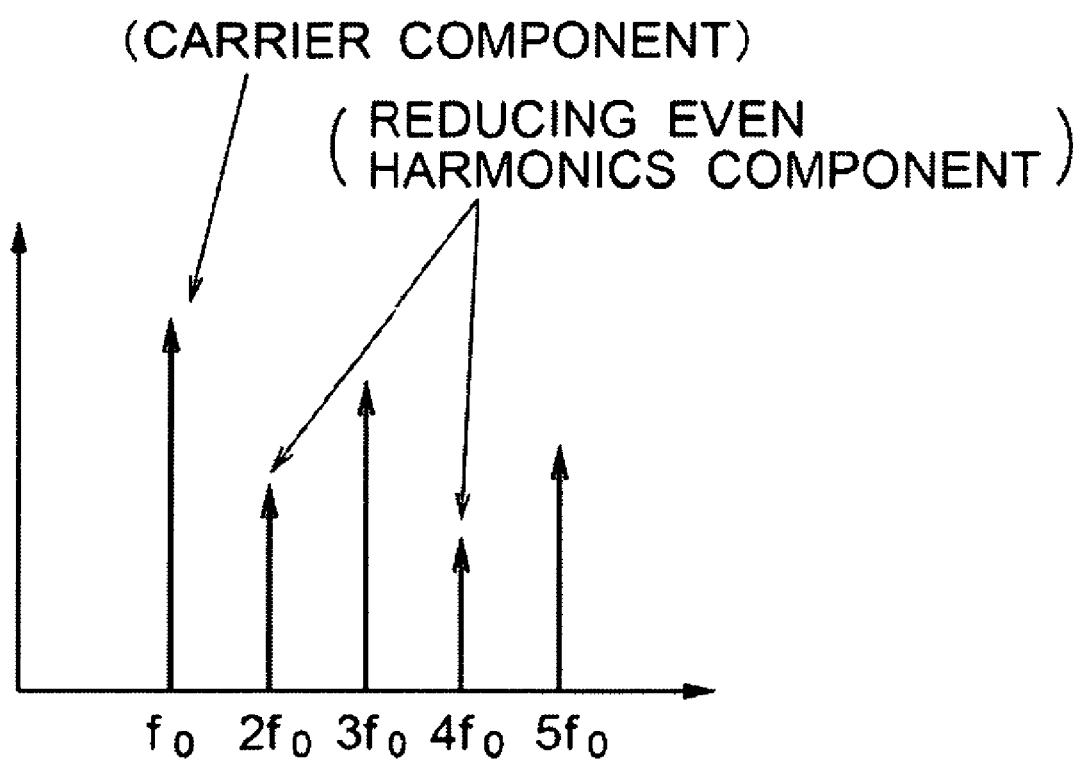
FIG. 38 is a diagram showing a spectrum distribution of the output of the power amplifier shown in FIG. 37.

5 Pulse wave forming device
5A Pulse generation circuit
5B Pulse generation circuit
10, 80, 140 Power amplifier unit (Amplifying apparatus)
11, 12, 31, 32, 33, 41, 42, 601, 801-806, 1202 Amplification circuit (Amplifier)
2801 Spectrum detecting device
2802 Operation control circuit
2803 Current measuring circuit
M11, M13, M51, M53, WP1, WP2 PMOS transistor as amplifier
M12, M14, M52, M54, WN1, WN2 NMOS transistor as amplifier

The invention claimed is:

1. An amplifying apparatus comprising a pair of amplification circuits operable in parallel,
wherein each of the amplification circuits configures an inverter type amplifier that is formed by combining a plurality of inverting amplifiers whose output sides are connected to each other, and the plurality of inverting amplifiers are driven at a same frequency, and
wherein an output terminal of the pair of amplification circuits is commonly connected to an input terminal of a band transmission filter unit.

2. The amplifying apparatus of claim 1,
wherein one of the amplification circuits is configured with a first inverting amplifier to which a reference pulse is inputted to be amplified and a second inverting amplifier to which an inverted pulse obtained by shifting and inverting a phase of the reference pulse is inputted, and
wherein the other amplifying circuit is configured with a first inverting amplifier and a second inverting amplifier to each of which other wide pulse with a width greater than a width of the reference pulse is commonly inputted.

3. The amplifying apparatus of claim 2, wherein, to the first inverting amplifier and the second inverting amplifier included in the other amplifying circuit, a reference pulse and an inverted pulse obtained by shifting and inverting a phase of the reference pulse are inputted, similar to a case of the plurality of inverting amplifiers forming the one amplification circuit.

4. The amplifying apparatus of claim 2,
wherein the one amplifying circuit is configured with a first inverting amplifier formed by an NMOS transistor and a second inverting amplifier formed by a PMOS transistor, and
wherein the other amplifying circuit is configured with a first inverting amplifier formed by an NMOS transistor and a second inverting amplifier formed by a PMOS transistor.

5. The amplifying apparatus of claim 2,
wherein the one amplification circuit is configured with a first inverting amplifier to which a reference pulse is inputted and a second inverting amplifier to which an inverted pulse formed by shifting a phase of the reference pulse by 180 degrees is inputted to be inverted and amplified, and
wherein the other amplification circuit is configured with a first inverting amplifier to which the reference pulse is inputted and a second inverting amplifier to which an inverted pulse formed by shifting the phase of the reference pulse by 180 degrees is inputted to be inverted and amplified.

6. The amplifying apparatus of claim 5, wherein the reference pulse inputted into the first inverting amplifier forming the other amplification circuit is being a reference pulse generated by forwarding the phase of the reference pulse inputted into the first inverting amplifier forming the one amplification circuit by 45 degrees.

7. The amplifying apparatus as claimed in claim 1, wherein phase difference between the input pulse waves inputted to the two or more amplification circuits are set to be a multiple number of 360/N degrees (N is an arbitrary integer number).

8. The amplifying apparatus as claimed in claim 7, wherein each of the amplification circuits are configured with a PMOS pull-up transistor and an NMOS pull-down transistor, and input signals to the PMOS pull-up transistor and the NMOS pull-down transistor are different in pulse width or pulse rising phase from each other.

9. The amplifying apparatus as claimed in claim 8, wherein the PMOS pull-up transistor is drive-controlled by a first control signal, the NMOS pull-down transistor is drive-controlled by a second control signal, and controls by the first control signal and the second control signal can be performed independently.

10. The amplifying apparatus as claimed in claim 1, wherein input pulse waves inputted to the two or more amplification circuits are same in pulse width and different in pulse phase.

11. The amplifying apparatus as claimed in claim 10, wherein the two or more amplification circuits are drive-controlled by a control signal.

12. The amplifying apparatus as claimed in claim 10, wherein each of the amplification circuits is configured with a PMOS pull-up transistor and an NMOS pull-down transistor, and the input signals to the PMOS pull-up transistor and the NMOS pull-down transistor are different in pulse width and pulse rising phase from each other.

13. The amplifying apparatus as claimed in claim 12, wherein the PMOS pull-up transistor is drive-controlled by a first control signal, the NMOS pull-down transistor is drive-controlled by a second control signal, and controls by the first control signal and the second control signal can be performed independently.

14. The amplifying apparatus as claimed in claim 1, wherein input pulse waves inputted to the two or more amplification circuits are different in width from each other, and the two or more amplification circuits are drive-controlled by a control signal.

15. The amplifying apparatus as claimed in claim 14, wherein the amplification circuit comprises an operation control circuit which controls the operation of each amplification circuit independently and a spectrum detecting circuit which detects information according to the waveform of an output signal outputted to outside, and the operation control circuit, by being activated based on the detection information sent from the spectrum detecting circuit and controlling the amplification circuit independently, controls the waveform of the output signal outputted from the amplification circuit to be a preset output waveform close to a sinusoidal waveform.

16. The amplifying apparatus as claimed in claim 14, wherein the amplification circuit comprises an operation control circuit which controls the operation of each amplification circuit independently and a cun ent measuring circuit which measures output cun ent outputted from the amplification circuit, and the operation control circuit, by being activated based on the current information measured at the current measuring circuit and controlling the amplification circuit independently, controls the waveform of the output signal outputted from the amplification circuit to be a preset output waveform close to a sinusoidal waveform.

17. The amplifying apparatus as claimed in claim 1, wherein the two or more amplification circuits are integrated to be formed on a same substrate.

18. The amplifying apparatus as claimed in claim 1, wherein the two or more amplification circuits are connected in parallel.

19. An output control method for an amplifying apparatus, comprising:
amplifying two of different input signals having a same frequency by a plurality of digitally-controlled amplification circuits connected in parallel, and amplifying other two of different input signals having a same frequency, inputted simultaneously with the two different input signals, by a plurality of digitally-controlled amplification circuits connected in parallel;
detecting a waveform and an output level of the outputted amplifier output which is formed by synthesizing the input signals amplified by the amplification circuits at the output side, and, controlling each of the amplification circuits independently based on the detected output power information to bring the waveform of the output signal outputted from the amplification circuit closer to a sinusoidal waveform,
wherein each of the amplification circuits configures an inverter type amplifier that is formed by combining a plurality of inverting amplifiers whose output sides are connected to each other, and the plurality of inverting amplifiers are driven at a same frequency, and
wherein an output terminal of the amplification circuits is commonly connected to an input terminal of a band transmission filter unit.

20. A computer readable recording medium storing an output control program for an amplifying apparatus, causing a computer to execute functions of:
amplifying two of different input signals having a same frequency by digital control, and amplifying other two of the different input signals having a same frequency, inputted simultaneously with the above described two different input signals, by digital control;
detecting a waveform and an output level of the outputted amplifier output formed by synthesizing the input signals amplified, at the output side; and bringing the waveform of the signal amplified and outputted closer to a sinusoidal waveform based on the detected output power information,
wherein each of the amplification circuits configures an inverter type amplifier that is formed by combining a plurality of inverting amplifiers whose output sides are connected to each other, and the plurality of inverting amplifiers are driven at a same frequency, and
wherein an output terminal of the amplification circuits is commonly connected to an input terminal of a band transmission filter unit.

21. The computer readable recording medium storing as claimed in claim 20, wherein the output control program further causes the computer to execute a function of controlling a plurality of signal amplifications independently based on the detected information about the waveform and the output level of the outputted amplifier output.

* * * * *